United States Patent
Ono et al.

(10) Patent No.: US 12,341,050 B2
(45) Date of Patent: Jun. 24, 2025

(54) ELECTROSTATIC CHUCK

(71) Applicant: TOTO LTD., Kitakyushu (JP)

(72) Inventors: Akihito Ono, Kitakyushu (JP); Tetsuro Itoyama, Kitakyushu (JP); Tomoki Umetsu, Kitakyushu (JP); Jumpei Uefuji, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 168 days.

(21) Appl. No.: 18/121,627

(22) Filed: Mar. 15, 2023

(65) Prior Publication Data

US 2023/0317495 A1    Oct. 5, 2023

(30) Foreign Application Priority Data

Mar. 29, 2022 (JP) .................. 2022-053876
Sep. 28, 2022 (JP) .................. 2022-154960

(51) Int. Cl.
*H01L 21/683* (2006.01)
*H01J 37/32* (2006.01)
*H05B 3/26* (2006.01)

(52) U.S. Cl.
CPC .... *H01L 21/6833* (2013.01); *H01J 37/32715* (2013.01); *H01L 21/683* (2013.01); *H05B 3/265* (2013.01); *H01J 2237/2007* (2013.01)

(58) Field of Classification Search
CPC ............ H01L 21/683; H01L 21/3833; H01L 21/67109; H01L 21/67103; H01J 37/32; H01J 37/32715; H01J 2237/2007; H05B 3/26; H02N 13/00

USPC ........................................... 361/234
See application file for complete search history.

(56) References Cited

U.S. PATENT DOCUMENTS

| | | | |
|---|---|---|---|
| 11,950,329 B2* | 4/2024 | Miwa ............... | H05B 3/06 |
| 2015/0228513 A1 | 8/2015 | Parkhe et al. | |
| 2015/0340255 A1* | 11/2015 | Parkhe ............ | H01L 21/67248 |
| | | | 165/80.5 |
| 2016/0020128 A1 | 1/2016 | Wang et al. | |
| 2017/0140958 A1 | 5/2017 | Kitagawa et al. | |

(Continued)

FOREIGN PATENT DOCUMENTS

| | | |
|---|---|---|
| JP | 2015-220368 A | 12/2015 |
| JP | 2017-512385 A | 5/2017 |

(Continued)

*Primary Examiner* — Danny Nguyen
(74) *Attorney, Agent, or Firm* — Carrier, Shende & Associates P.C.; Fulchand P. Shende; Joseph P. Carrier

(57) ABSTRACT

An electrostatic chuck includes a base plate, a first heater element, and a plurality of first power feeding terminals. The base plate includes a communicating path having a spiral shape. The first heater element includes a plurality of first zones. The plurality of first power feeding terminals feeds power to the plurality of first zones. Each of the plurality of first zones includes a first heater line and a pair of first power feeding portions feeding power to the first heater line. The pair of first power feeding portions is electrically connected to the plurality of first power feeding terminals. The plurality of first power feeding terminals includes a first and a second annular portion. The communicating path includes a first circumferential portion surrounding the second annular portion between the first annular portion and the second annular portion when viewed along a stacking direction.

7 Claims, 22 Drawing Sheets

(56) References Cited

U.S. PATENT DOCUMENTS

| | | |
|---|---|---|
| 2017/0345668 A1 | 11/2017 | Takebayashi et al. |
| 2020/0312684 A1 | 10/2020 | Mine et al. |
| 2022/0013397 A1 | 1/2022 | Lee et al. |

FOREIGN PATENT DOCUMENTS

| | | |
|---|---|---|
| JP | 2017-157617 A | 9/2017 |
| JP | 2017-228649 A | 12/2017 |
| JP | 2020-161597 A | 10/2020 |
| KR | 2022-0006952 A | 1/2022 |
| WO | 2017/115758 A1 | 7/2017 |

\* cited by examiner

ELECTROSTATIC CHUCK

CROSS-REFERENCE TO RELATED APPLICATIONS

This application is based upon and claims the benefit of priority from Japanese Patent Application No. 2022-053876, filed on Mar. 29, 2022, and No. 2022-154960, filed on Sep. 28, 2022; the entire contents of which are incorporated herein by reference.

FIELD

Embodiments described herein relate generally to an electrostatic chuck.

BACKGROUND

An electrostatic chuck configured to have a process object such as a semiconductor wafer, a glass substrate, or the like placed thereon is known. The electrostatic chuck is used as a member for clamping and holding the process object in, for example, a plasma processing chamber of a semiconductor manufacturing apparatus in which etching, chemical vapor deposition (CVD), sputtering, ion implantation, ashing, or the like is performed. For example, the electrostatic chuck applies an electrostatic clamping power to embedded electrodes and clamps a substrate such as a silicon wafer or the like by an electrostatic force.

The electrostatic chuck includes a ceramic dielectric substrate having a placement surface on which the process object is placed, and a base plate supporting the ceramic dielectric substrate. A coolant flow path may be provided in the base plate to cool the process object.

On the other hand, methods of controlling the in-plane temperature distribution of the process object include a known method that uses an electrostatic chuck in which a heater (a heating element) is embedded. For example, the heater is divided into multiple zones that can independently control the temperature. The in-plane temperature distribution of the process object (the placement surface of the process object) can be more finely controlled thereby. The number of such zones has been increasing in recent years and may be, for example, greater than 100 in some cases. To independently control the temperatures of the zones, the number of power feeding terminals for feeding power to the zones also is increasing. There is a risk that the uniformity of the in-plane temperature distribution of the process object may degrade according to the arrangement of the power feeding terminals and the coolant flow path.

SUMMARY

According to the embodiment, an electrostatic chuck includes a ceramic dielectric substrate, a base plate, a first heater element, and a plurality of first power feeding terminals. The ceramic dielectric substrate is configured to have a process object placed thereon. The base plate supports the ceramic dielectric substrate. The base plate has an upper surface at the ceramic dielectric substrate side and a lower surface opposite to the upper surface. The base plate includes a communicating path located between the upper surface and the lower surface. The communicating path has a spiral shape and is configured to allow a coolant to pass. The first heater element includes a plurality of first zones arranged in a radial direction and a circumferential direction. The first heater element includes not less than twenty of the first zones. The plurality of first power feeding terminals feeds power to the plurality of first zones. Each of the plurality of first zones includes a first heater line and a pair of first power feeding portions. The first heater line emits heat by allowing a current to flow. The pair of first power feeding portions feeds power to the first heater line. A number of the plurality of first power feeding terminals is not less than a number of the first zones. The pair of first power feeding portions is electrically connected to the plurality of first power feeding terminals. The plurality of first power feeding terminals includes a first annular portion and a second annular portion. The first annular portion includes a portion of first power feeding terminals among the plurality of first power feeding terminals. The portion of power feeding terminals included in the first annular portion is disposed on a first virtual circle. A number of the portion of first power feeding terminals included in the first annular portion is at least seven. The second annular portion includes an other portion of first power feeding terminals among the plurality of first power feeding terminals. The second annular portion is positioned inward of the first annular portion. The other portion of first power feeding terminals included in the second annular portion is disposed on a second virtual circle. A number of the other portion of first power feeding terminals included in the second annular portion is at least seven. The communicating path includes a first circumferential portion. The first circumferential portion surrounds the second annular portion between the first annular portion and the second annular portion when viewed along a stacking direction of the base plate and the ceramic dielectric substrate.

DETAILED DESCRIPTION

Figure 1:
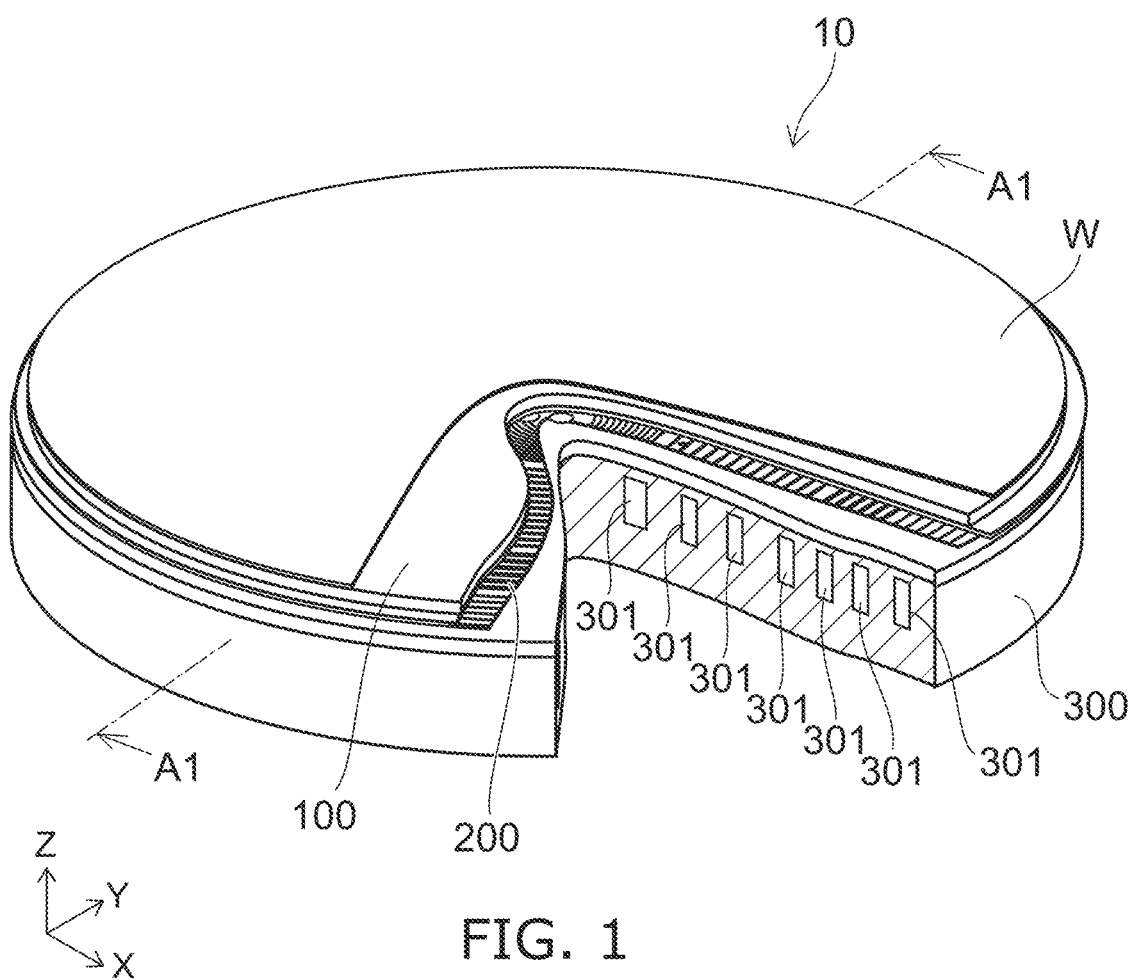
FIG. 1 is a perspective view schematically illustrating an electrostatic chuck according to an embodiment.

A first invention is an electrostatic chuck including a ceramic dielectric substrate configured to have a process object placed thereon, a base plate supporting the ceramic dielectric substrate, a first heater element including multiple first zones arranged in a radial direction and a circumferential direction, and multiple first power feeding terminals feeding power to the multiple first zones; the base plate has an upper surface at the ceramic dielectric substrate side, and a lower surface opposite to the upper surface; the base plate includes a communicating path located between the upper surface and the lower surface; the communicating path is configured to allow a coolant to pass and has a spiral shape; the first heater element includes not less than twenty of the first zones; each of the multiple first zones includes a first heater line emitting heat by allowing a current to flow, and a pair of first power feeding portions feeding power to the first heater line; a number of the multiple first power feeding terminals is not less than a number of the first zones; the pair of first power feeding portions is electrically connected to the multiple first power feeding terminals; the multiple first power feeding terminals include a first annular portion and a second annular portion; the first annular portion includes a portion of first power feeding terminals among the multiple first power feeding terminals; the portion of power feeding terminals included in the first annular portion is disposed on a first virtual circle; a number of the portion of first power feeding terminals included in the first annular portion is at least seven; the second annular portion includes another portion of first power feeding terminals among the multiple first power feeding terminals, and is positioned inward of the first annular portion; the other portion of first power feeding terminals included in the second annular portion is disposed on a second virtual circle; a number of the other portion of first power feeding terminals included in the second annular portion is at least seven; and the communicating path includes a first circumferential portion surrounding the second annular portion between the first annular portion and the second annular portion when viewed along a stacking direction of the base plate and the ceramic dielectric substrate.

According to the electrostatic chuck, the first heater element includes not less than twenty first zones; the multiple first power feeding terminals include the first annular portion and the second annular portion; and the first circumferential portion of the communicating path in the base plate is disposed between the first annular portion and the second annular portion when viewed in plan. The temperature unevenness in the radial direction and circumferential direction caused by the positions of the first power feeding terminals can be suppressed thereby, and the uniformity of the in-plane temperature distribution can be increased.

A second invention is the electrostatic chuck of the first invention, wherein the multiple first zones include a first annular zone region; the first annular zone region includes a portion of first zones among the multiple first zones; the portion of first zones included in the first annular zone region is arranged in the circumferential direction; the portion of first power feeding terminals included in the first annular portion feeds power to the portion of first zones included in the first annular zone region; and the number of the portion of first power feeding terminals included in the first annular portion is greater than $2 \times N1 \times 0.6$, where $N1$ is a number of the portion of first zones included in the first annular zone region.

According to the electrostatic chuck, for example, more than 60% of the first power feeding terminals feeding power to the multiple first zones included in the first annular zone region are included in the first annular portion. The uniformity of the in-plane temperature distribution can be further improved thereby.

A third invention is the electrostatic chuck of the first invention, wherein the multiple first zones include a first annular zone region; the first annular zone region includes a portion of first zones among the multiple first zones; the portion of first zones included in the first annular zone region is arranged in the circumferential direction; the portion of first power feeding terminals included in the first annular portion feeds power to the portion of first zones included in the first annular zone region; and a zone center of the first annular zone region is aligned with at least one of a first center of the first virtual circle or a second center of the second virtual circle.

According to the electrostatic chuck, by aligning the center of at least one of the first virtual circle or the second virtual circle with the zone center of the first annular zone region, for example, the bias of the positions of the first power feeding terminals included in at least one of the first annular portion or the second annular portion with respect to the first zones included in the first annular zone region can be suppressed. The uniformity of the in-plane temperature distribution can be further improved thereby.

A fourth invention is the electrostatic chuck of the third invention, wherein the at least one is the first center of the first virtual circle.

According to the electrostatic chuck, the bias of the positions of the first power feeding terminals included in the first annular portion with respect to the first zones included in the first annular zone region can be suppressed. The first annular portion is positioned outward of the second annular portion. Therefore, for example, the uniformity of the temperature distribution at the outer circumference of the placement surface can be further improved.

A fifth invention is the electrostatic chuck of any one of the first to fourth inventions, wherein the portion of first power feeding terminals included in the first annular portion are uniformly arranged in the circumferential direction.

According to the electrostatic chuck, the uniformity of the temperature distribution in the circumferential direction can be further improved.

A sixth invention is the electrostatic chuck of any one of the first to fifth inventions, further including a second heater element and multiple second power feeding terminals; the second heater element includes multiple second zones arranged in at least the radial direction; the multiple second power feeding terminals feed power to the multiple second zones; each of the multiple second zones includes a second heater line emitting heat by allowing a current to flow, and a pair of second power feeding portions feeding power to the second heater line; a number of the multiple second power feeding terminals is not less than a number of second zones; each of the pair of second power feeding portions is electrically connected to one of the multiple second power feeding terminals; and at least a portion of the multiple second power feeding terminals overlaps at least one of the first virtual circle or the second virtual circle when viewed along the stacking direction.

According to the electrostatic chuck, the temperature unevenness caused by the positions of the second power feeding terminals can be suppressed, and the uniformity of the in-plane temperature distribution can be increased.

A seventh invention is the electrostatic chuck of the sixth invention, wherein the number of the multiple first zones is greater than the number of the multiple second zones.

According to the electrostatic chuck, for example, the number of first power feeding terminals is greater than the number of second power feeding terminals because the number of the first zones is relatively large. The temperature unevenness in the radial direction and circumferential direction caused by the positions of the first power feeding terminals can be suppressed, and the uniformity of the in-plane temperature distribution can be further improved.

Hereinafter, embodiments of the invention will be described with reference to the drawings. It is noted that, in each figure, similar components are denoted by the same reference numerals, and detailed description thereof will be omitted as appropriate.

FIG. 1 is a perspective view schematically illustrating an electrostatic chuck according to an embodiment.

Figure 2A:
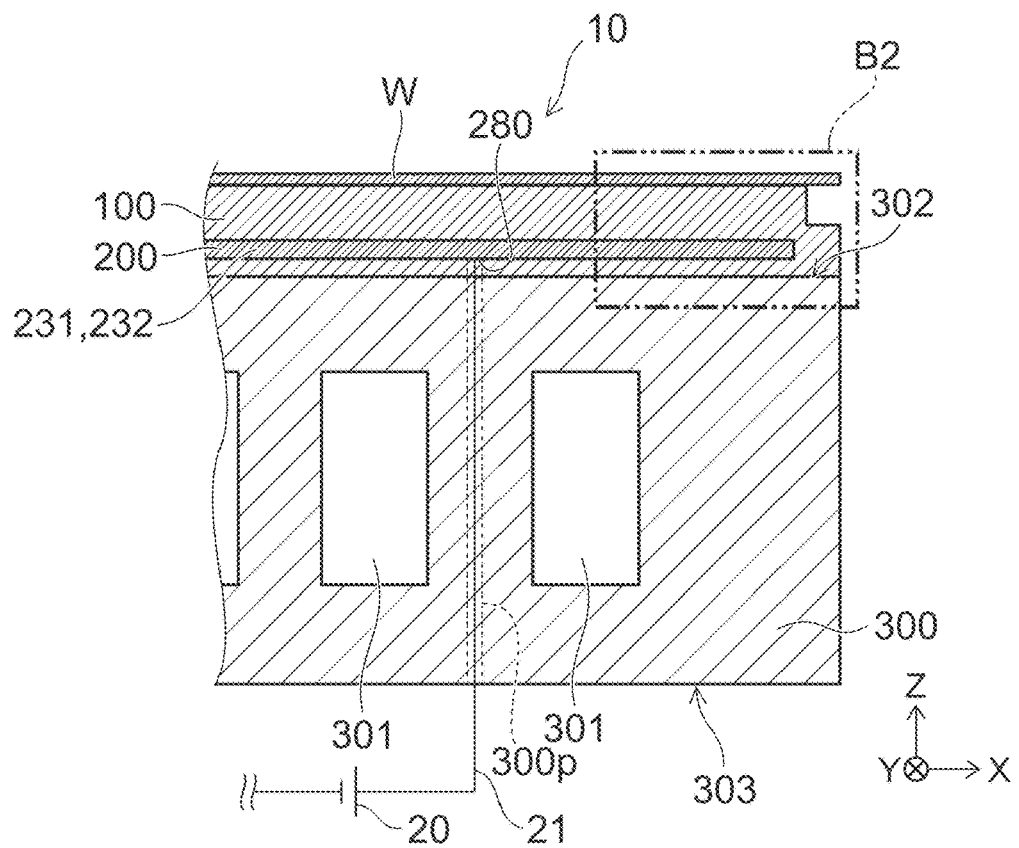
FIGS. 2A and 2B are cross-sectional views schematically illustrating a portion of the electrostatic chuck according to the embodiment.
Figure 2B:
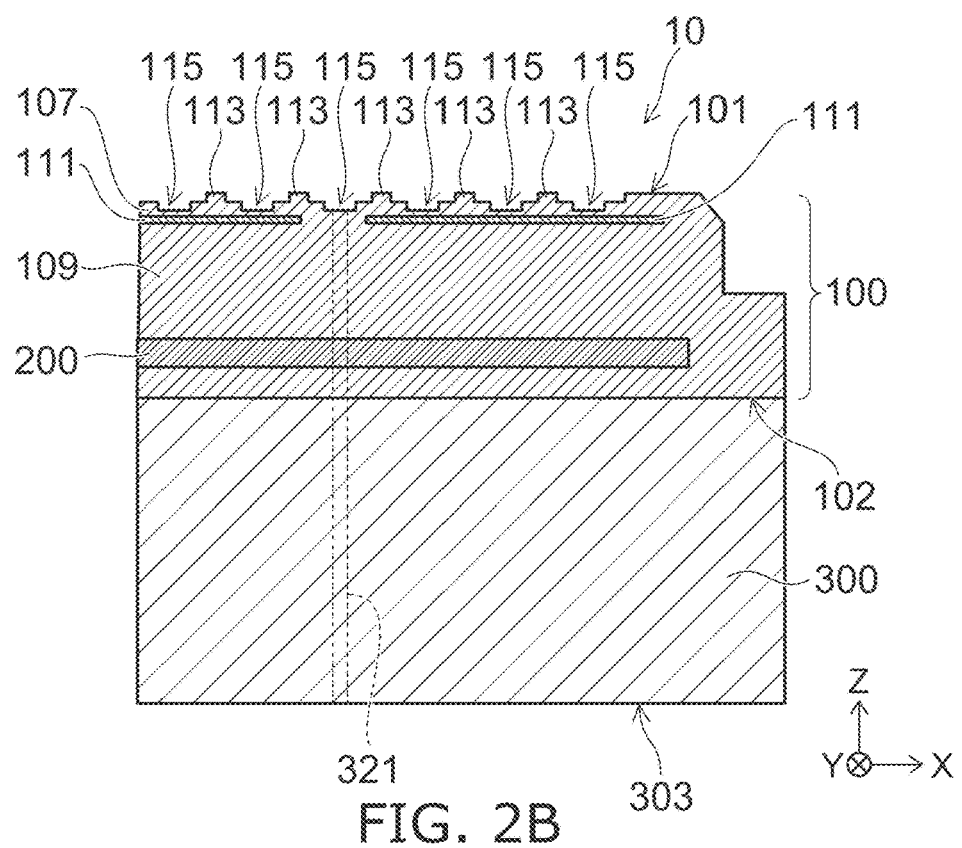

FIGS. 2A and 2B are cross-sectional views schematically illustrating a portion of the electrostatic chuck according to the embodiment.

In FIG. 1, for the convenience of description, a cross-sectional view is illustrated in a portion of the electrostatic chuck.

FIG. 2A is a cross-sectional view taken along line A1-A1 illustrated in FIG. 1.

FIG. 2B is an enlarged view of a region B1 illustrated in FIG. 2A. In FIG. 2B, a process object W is omitted.

As illustrated in FIGS. 1, 2A, and 2B, the electrostatic chuck 10 according to the embodiment includes a ceramic dielectric substrate 100, a heater unit 200, and a base plate 300.

The ceramic dielectric substrate 100 is, for example, a flat-plate base material made of a polycrystalline ceramic sintered body, and has a first major surface 101 (a placement surface) configured to have the process object W such as a semiconductor wafer or the like placed thereon, and a second major surface 102 opposite to the first major surface 101.

In this specification, a direction perpendicular to the first major surface 101 is taken as a Z-direction. In other words, the Z-direction is a direction connecting the first major surface 101 and the second major surface 102. In other words, the Z-direction is the stacking direction from the base plate 300 toward the ceramic dielectric substrate 100. One direction orthogonal to the Z-direction is taken as an X-direction; and a direction orthogonal to the Z-direction and the X-direction is taken as a Y-direction. In this specification, "in the plane" is, for example, in the X-Y plane. In this specification, "when viewed in plan" refers to the state of being viewed along the Z-direction.

For example, $Al_2O_3$, AlN, SiC, $Y_2O_3$, YAG, etc., are examples of the material of the crystal included in the ceramic dielectric substrate 100. By using such a material, the infrared transmissivity, thermal conductivity, insulation resistance, and plasma resistance of the ceramic dielectric substrate 100 can be increased.

An electrode layer 111 is provided inside the ceramic dielectric substrate 100. The electrode layer 111 is interposed between the first major surface 101 and the second major surface 102. That is, the electrode layer 111 is formed so as to be inserted into the ceramic dielectric substrate 100. The electrode layer 111 is integrally sintered on the ceramic dielectric substrate 100.

The electrode layer 111 is not limited to being interposed between the first major surface 101 and the second major surface 102, and the electrode layer 111 may be attached to the second major surface 102.

The electrostatic chuck 10 generates charges on the first major surface 101 side of the electrode layer 111 by applying a clamping voltage to the electrode layer 111 and clamps the process object W by the electrostatic force.

The electrode layer 111 is provided along the first major surface 101 and the second major surface 102. The electrode layer 111 is a clamping electrode for clamping the process object W. The electrode layer 111 may be of a unipolar type or a bipolar type. The electrode layer 111 may be of a tripolar type or of a multipolar type. The number of electrode layers 111 and the arrangement of the electrode layers 111 are appropriately selected.

The base plate 300 is located at the second major surface 102 side of the ceramic dielectric substrate 100 and supports the ceramic dielectric substrate 100. As illustrated in FIG. 2A, the base plate 300 has an upper surface 302 at the ceramic dielectric substrate 100 side, and a lower surface 303 opposite to the upper surface 302. The base plate 300 includes a communicating path 301 (a coolant flow path) provided between the upper surface 302 and the lower surface 303. That is, the communicating path 301 is provided inside the base plate 300. For example, aluminum, aluminum alloys, titanium, and titanium alloys are examples of the material of the base plate 300.

The base plate 300 performs the role of temperature adjustment of the ceramic dielectric substrate 100. For example, when cooling the ceramic dielectric substrate 100, a cooling medium is caused to flow into the communicating path 301, pass through the communicating path 301, and flow out of the communicating path 301. Accordingly, the heat of the base plate 300 is absorbed by the cooling medium; and the ceramic dielectric substrate 100 mounted on the base plate 300 can be cooled. In other words, the communicating path 301 functions as a coolant flow path through which a coolant can pass.

Convex portions 113 are provided on the first major surface 101 side of the ceramic dielectric substrate 100, as needed. Grooves 115 are provided between the adjacent convex portions 113. The grooves 115 communicate with each other. A space is formed between the grooves 115 and a back side of the process object W mounted on the electrostatic chuck 10.

An introduction path 321 penetrating the base plate 300 and the ceramic dielectric substrate 100 is connected to the groove 115. When a transfer gas such as helium (He) is introduced from the introduction path 321 in a state where the process object W is clamped and held, the transfer gas flows into the space provided between the process object W and the groove 115, and the process object W can be directly heated or cooled by the transfer gas.

The heater unit 200 heats the ceramic dielectric substrate 100. The heater unit 200 heats the process object W via the ceramic dielectric substrate 100 by heating the ceramic dielectric substrate 100. In the example, the heater unit 200 is located between the first major surface 101 and the second major surface 102. In other words, the heater unit 200 is located inside the ceramic dielectric substrate 100. The heater unit 200 is formed so as to be inserted into the ceramic dielectric substrate 100. In other words, the heater unit 200 is embedded in the ceramic dielectric substrate 100.

A power feeding terminal 280 described below (a sub-power feeding terminal 281 or a main power feeding terminal 282) is provided in the heater unit 200. As illustrated in FIG. 2A, for example, the power feeding terminal 280 is electrically connected to a power supply 20 via an electrically-conductive part 21 (a wiring part, a probe, a socket, a terminal, etc.). The heater line of the heater unit 200 generates heat by allowing a current to flow from the power supply 20 through the heater line via the electrically-conductive part 21 and the power feeding terminal 280.

A terminal hole 300*p* for disposing at least one of the power feeding terminal 280 or the electrically-conductive part 21 is provided in the base plate 300. The terminal hole 300*p* is disposed according to the position of the power feeding terminal 280. For example, the terminal hole 300*p* includes a portion that overlaps the power feeding terminal 280 in the Z-direction and extends in the Z-direction. A portion of the terminal hole 300*p* is arranged with the communicating path 301 in the X-Y plane. For example, the terminal hole 300*p* extends from the upper surface 302 to the lower surface 303 of the base plate 300 and penetrates the base plate 300.

The multiple power feeding terminals 280 are provided as described below. Therefore, for example, the multiple terminal holes 300*p* are provided so as to correspond respectively to the multiple power feeding terminals 280. For example, at least one of the power feeding terminal 280 or the electrically-conductive part 21 is disposed in each of the multiple terminal holes 300*p*.

The heater unit 200 may be provided separately from the ceramic dielectric substrate 100. In such a case, the heater unit 200 is located between the ceramic dielectric substrate 100 and the base plate 300. For example, an adhesive layer is located between the base plate 300 and the heater unit 200. The adhesive layer is located between the heater unit 200 and the ceramic dielectric substrate 100. A heat-resistant resin that has a relatively high thermal conductivity such as silicone or the like is an example of the material of the adhesive layer.

The heater unit 200 includes a first heater element 231 and a second heater element 232 described below.

Figure 3:
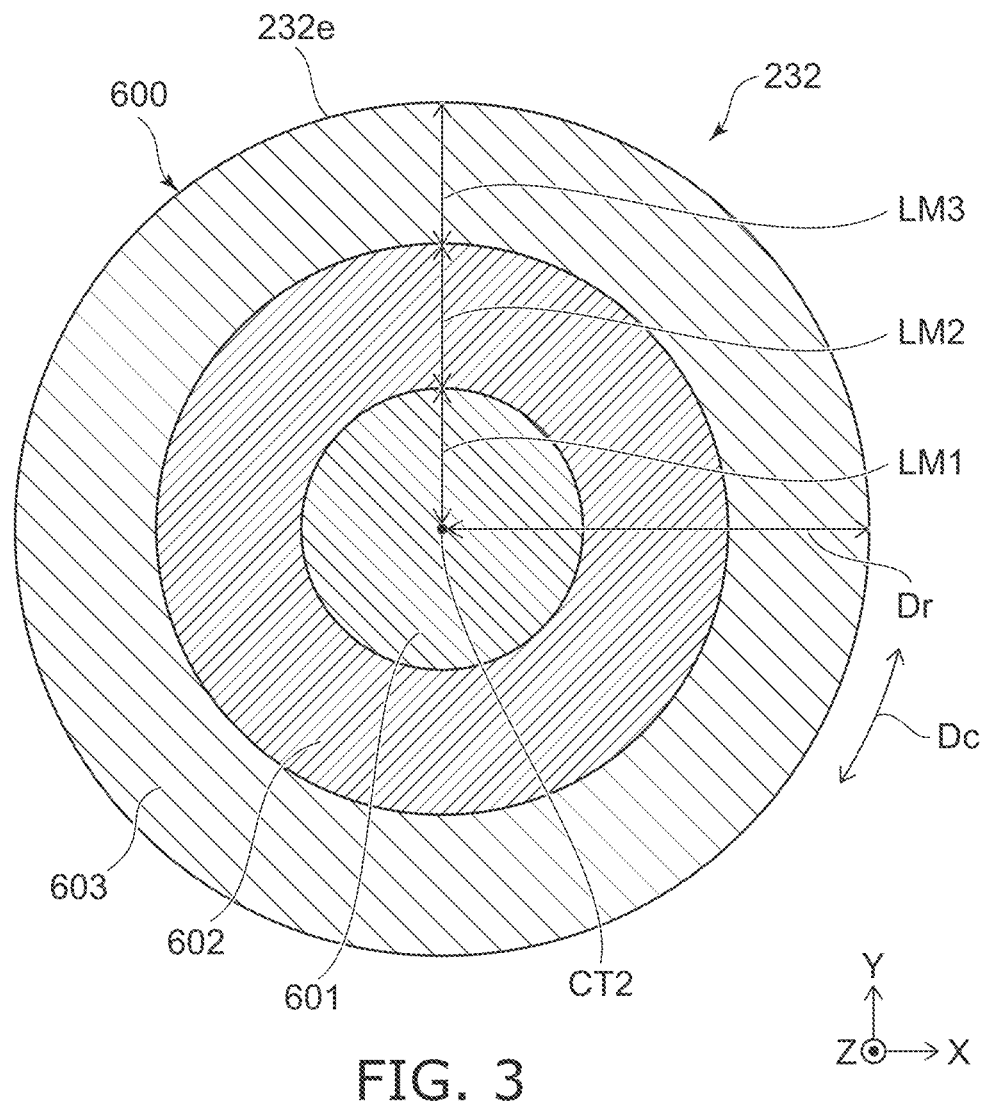
FIG. 3 is a plan view schematically illustrating the second heater element according to the embodiment.

FIG. 3 is a plan view schematically illustrating the second heater element according to the embodiment.

FIG. 3 is a view in which the second heater element 232 is projected onto a plane perpendicular to the Z-direction. As illustrated in FIG. 3, the second heater element 232 includes multiple main zones 600 (second zones) divided in at least a radial direction Dr. In other words, the multiple main zones 600 are arranged in at least the radial direction Dr. In the second heater element 232, independent temperature control is performed in each of the main zones 600.

In this specification, the "radial direction Dr" is a direction from the center of the heater element (e.g., the first heater element 231) toward the outer circumference along a radius. A "circumferential direction Dc" is a direction along the outer circumference of the heater element (e.g., the first heater element 231). The radial direction Dr may be the radial direction of the ceramic dielectric substrate 100 or the base plate 300. The circumferential direction Dc may be the circumferential direction of the ceramic dielectric substrate 100 or the base plate 300.

In the example, the multiple main zones 600 include three main zones 601 to 603 arranged in the radial direction Dr. That is, the second heater element 232 is divided into three zones in the radial direction Dr. The main zones 600 are arranged in the order of the main zone 601, the main zone 602, and the main zone 603 from a center CT2 of the second heater element 232 outward in the radial direction Dr.

In the example, the main zone 601 has a circular shape centered on the center CT2 when viewed in plan. The main zone 602 has an annular shape centered on the center CT2 positioned outside the main zone 601 when viewed in plan. The main zone 603 has an annular shape centered on the center CT2 positioned outside the main zone 602 when viewed in plan.

In the example, a width LM1 in the radial direction Dr of the main zone 601, a width LM2 in the radial direction Dr of the main zone 602, and a width LM3 in the radial direction Dr of the main zone 603 are the same. The widths LM1 to LM3 may be different from each other.

The number of the main zones 600 and the shape of the main zone 600 when viewed in plan may be arbitrary. The main zone 600 may be divided in the circumferential direction Dc and may be divided in the circumferential direction Dc and the radial direction Dr. The configurations inside the main zones 600 are described below.

For convenience in FIG. 3, the end portions in the radial direction Dr of the main zones 600 are shown as being in contact with each other, but actually, a gap (i.e., a portion where a main heater line 232*c* is not provided) exists between the end portions; and the end portions in the radial direction Dr of adjacent main zones do not contact each other. This is the same for the following figures.

Figure 4:
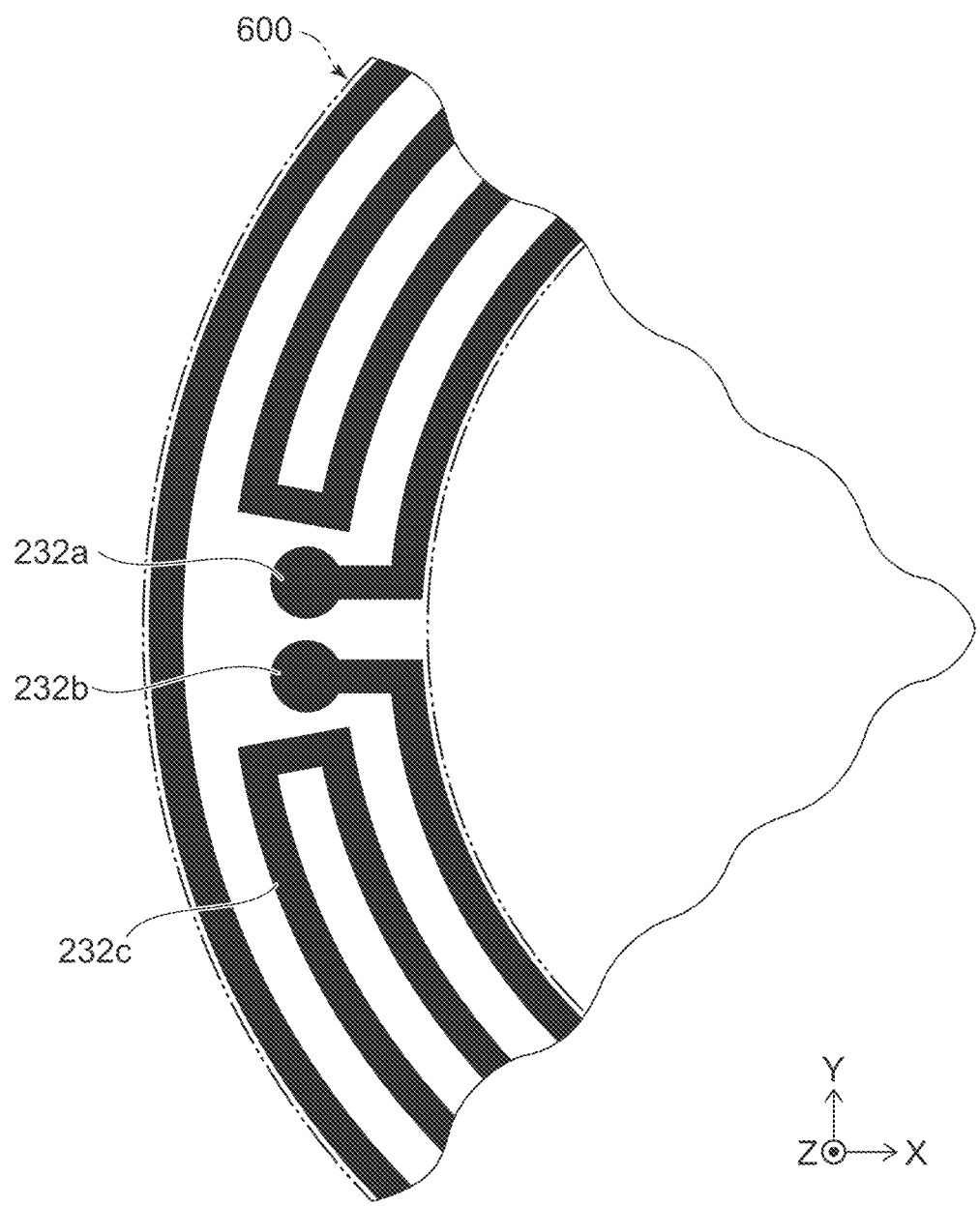
FIG. 4 is a plan view schematically illustrating a portion of the main zone of the second heater element according to the embodiment.

FIG. 4 is a plan view schematically illustrating a portion of the main zone of the second heater element according to the embodiment.

The main zone 600 includes a second heater line (the main heater line 232*c*) and a pair of second power feeding portions (a first main power feeding portion 232*a* and a second main power feeding portion 232*b*). The main heater line 232*c* is electrically connected to the first and second main power feeding portions 232*a* and 232*b*. The first main power feeding portion 232*a* is located at one end of the main heater line 232*c*; and the second main power feeding portion 232*b* is located at the other end of the main heater line 232*c*. The first main power feeding portion 232*a* and the second main power feeding portion 232*b* each are, for example, electrically-conductive parts (metal films or metal foils) that are wider than the main heater line 232*c*. The main heater line 232*c* is, for example, an electrically-conductive part (a metal film or metal foil) that is relatively narrow. The main heater line 232*c* generates heat by allowing a current to flow. The first main power feeding portion 232*a* and the second main power feeding portion 232b feed power to the main heater line 232c. One main zone 600 includes one first main power feeding portion 232a, one second main power feeding portion 232b, and one main heater line 232c. The main zone 600 is a region that includes the continuous main heater line 232c connecting the first and second main power feeding portions 232a and 232b.

The main heater lines 232c that are included in the main zones 600 are independent of each other. Accordingly, a different voltage can be applied to each main zone 600 (main heater line 232c). Accordingly, the output (the generated heat amount) can be controlled independently for each main zone 600. In other words, the main zones 600 are heater units capable of mutually-independent temperature control; and the second heater element 232 is an aggregate of heater units including multiple heater units.

Figure 5:
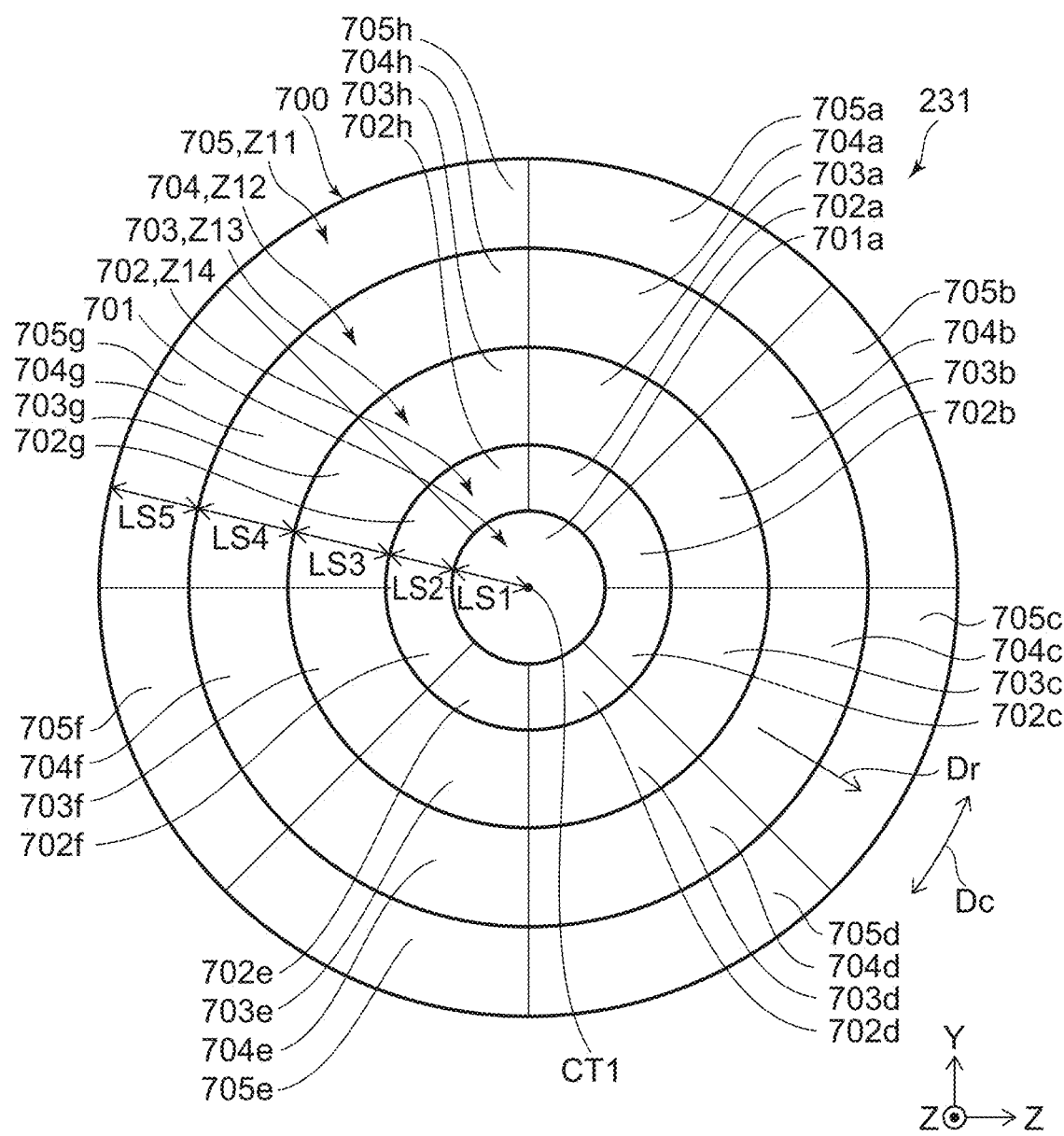
FIG. 5 is a plan view schematically illustrating the first heater element according to the embodiment.

FIG. 5 is a plan view schematically illustrating the first heater element according to the embodiment.

FIG. 5 is a view in which the first heater element 231 is projected onto a plane perpendicular to the Z-direction. In the example as illustrated in FIG. 5, the first heater element 231 includes multiple sub-zones 700 (first zones) divided in the radial direction Dr and the circumferential direction Dc. In other words, the multiple sub-zones 700 are arranged in the radial direction Dr and the circumferential direction Dc. In the first heater element 231, independent temperature control is performed in each sub-zone 700.

In the example, the multiple sub-zones 700 include a first region 701 made of a sub-zone 701a, a second region 702 made of sub-zones 702a to 702h arranged in the circumferential direction Dc, a third region 703 made of sub-zones 703a to 703h arranged in the circumferential direction Dc, a fourth region 704 made of sub-zones 704a to 704h arranged in the circumferential direction Dc, and a fifth region 705 made of sub-zones 705a to 705h arranged in the circumferential direction Dc. That is, the first heater element 231 is divided into five sub-zones in the radial direction Dr. The second to fifth regions 702 to 705 each are divided into eight sub-zones in the circumferential direction Dc. The first to fifth regions 701 to 705 are arranged in the order of the first region 701, the second region 702, the third region 703, the fourth region 704, and the fifth region 705 from a center CT1 of the first heater element 231 outward in the radial direction Dr.

The first region 701 (the sub-zone 701a) has a circular shape centered on the center CT1 when viewed in plan. The second to fifth regions 702 to 705 each have annular shapes centered on the center CT1 when viewed in plan. When viewed in plan, the second region 702 is positioned outward of the first region 701; the third region 703 is positioned outward of the second region 702; the fourth region 704 is positioned outward of the third region 703; and the fifth region 705 is positioned outward of the fourth region 704.

The second region 702 includes a portion of sub-zones 700 (the sub-zones 702a to 702h) among the multiple sub-zones 700. The sub-zones 702a to 702h are arranged in the circumferential direction Dc. Specifically, the sub-zones 702a to 702h in the second region 702 are disposed clockwise in the order of the sub-zone 702a, the sub-zone 702b, the sub-zone 702c, the sub-zone 702d, the sub-zone 702e, the sub-zone 702f, the sub-zone 702g, and the sub-zone 702h. In the example, the sub-zones 702a to 702h each are positioned outward of the sub-zone 701a. The sub-zones 702a to 702h each form portions of the annular second region 702. The second region 702 may be called a fourth annular zone region Z14 in the following description.

The third region 703 includes a portion of sub-zones 700 (the sub-zones 703a to 703h) among the multiple sub-zones 700. The sub-zones 703a to 703h are arranged in the circumferential direction Dc. Specifically, the sub-zones 703a to 703h in the third region 703 are disposed clockwise in the order of the sub-zone 703a, the sub-zone 703b, the sub-zone 703c, the sub-zone 703d, the sub-zone 703e, the sub-zone 703f, the sub-zone 703g, and the sub-zone 703h. In the example, the sub-zone 703a is positioned outward of the sub-zone 702a. The sub-zone 703b is positioned outward of the sub-zone 702b. The sub-zone 703c is positioned outward of the sub-zone 702c. The sub-zone 703d is positioned outward of the sub-zone 702d. The sub-zone 703e is positioned outward of the sub-zone 702e. The sub-zone 703f is positioned outward of the sub-zone 702f. The sub-zone 703g is positioned outward of the sub-zone 702g. The sub-zone 703h is positioned outward of the sub-zone 702h. The sub-zones 703a to 703h each form portions of the annular third region 703. The third region 703 may be called a third annular zone region Z13 in the following description.

The fourth region 704 includes a portion of sub-zones 700 (the sub-zones 704a to 704h) among the multiple sub-zones 700. The sub-zones 704a to 704h are arranged in the circumferential direction Dc. Specifically, the sub-zones 704a to 704h in the fourth region 704 are disposed clockwise in the order of the sub-zone 704a, the sub-zone 704b, the sub-zone 704c, the sub-zone 704d, the sub-zone 704e, the sub-zone 704f, the sub-zone 704g, and the sub-zone 704h. In the example, the sub-zone 704a is positioned outward of the sub-zone 703a. The sub-zone 704b is positioned outward of the sub-zone 703b. The sub-zone 704c is positioned outward of the sub-zone 703c. The sub-zone 704d is positioned outward of the sub-zone 703d. The sub-zone 704e is positioned outward of the sub-zone 703e. The sub-zone 704f is positioned outward of the sub-zone 703f. The sub-zone 704g is positioned outward of the sub-zone 703g. The sub-zone 704h is positioned outward of the sub-zone 703h. The sub-zones 704a to 704h each form portions of the annular fourth region 704. The fourth region 704 may be called a second annular zone region Z12 in the following description.

The fifth region 705 includes a portion of sub-zones 700 (the sub-zones 705a to 705h) among the multiple sub-zones 700. The sub-zones 705a to 705h are arranged in the circumferential direction Dc. Specifically, the sub-zones 705a to 705h in the fifth region 705 are disposed clockwise in the order of the sub-zone 705a, the sub-zone 705b, the sub-zone 705c, the sub-zone 705d, the sub-zone 705e, the sub-zone 705f, the sub-zone 705g, and the sub-zone 705h. In the example, the sub-zone 705a is positioned outward of the sub-zone 704a. The sub-zone 705b is positioned outward of the sub-zone 704b. The sub-zone 705c is positioned outward of the sub-zone 704c. The sub-zone 705d is positioned outward of the sub-zone 704d. The sub-zone 705e is positioned outward of the sub-zone 704e. The sub-zone 705f is positioned outward of the sub-zone 704f. The sub-zone 705g is positioned outward of the sub-zone 704g. The sub-zone 705h is positioned outward of the sub-zone 704h. The sub-zones 705a to 705h each form portions of the annular fifth region 705. The fifth region 705 may be called a first annular zone region Z11 in the following description.

In the example, a width LS1 (the radius) in the radial direction Dr of the first region 701, a width LS2 in the radial direction Dr of the second region 702, a width LS3 in the radial direction Dr of the third region 703, a width LS4 in the radial direction Dr of the fourth region 704, and a width LS5 in the radial direction Dr of the fifth region 705 are the same. The widths LS1 to LS5 may be different from each other.

The number of the multiple sub-zones 700 is greater than the number of the multiple main zones 600. That is, the first heater element 231 is divided into more zones than the second heater element 232. For example, the number of the multiple sub-zones 700 is not less than twenty. In the example, the number of the multiple sub-zones 700 is thirty-three; and the number of the multiple main zones 600 is three. Although not particularly limited, the upper limit of the number of the multiple sub-zones 700 is, for example, about 200.

By setting the number of the multiple sub-zones 700 included in the first heater element 231 to be greater than the number of the multiple main zones 600 included in the second heater element 232, the first heater element 231 can perform temperature adjustment in narrower regions than the second heater element 232. Accordingly, finer temperature adjustment by the first heater element 231 is possible, and the uniformity of the in-plane temperature distribution of the process object W can be increased. The number of the sub-zones 700 and the shape of the sub-zone 700 when viewed in plan may be arbitrary.

Although the end portions in the radial direction Dr of the sub-zones 700 are shown as being in contact with each other for convenience in FIG. 5, actually, a gap (i.e., a portion where a sub-heater line 231c is not provided) exists between the end portions; and the end portions in the radial direction Dr of adjacent sub-zones 700 do not contact each other. This is the same for the following figures.

Figure 6:
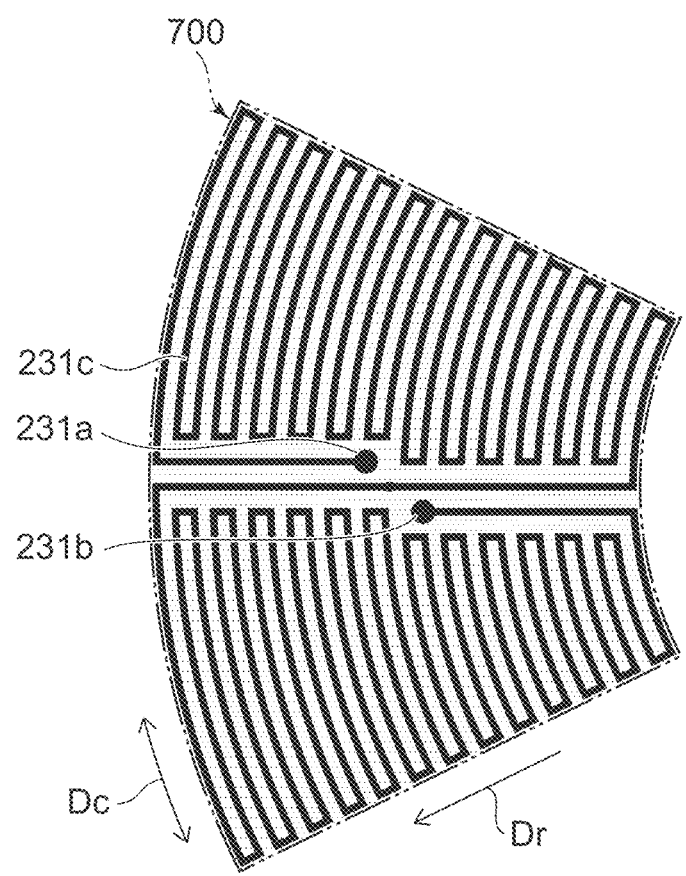
FIG. 6 is a plan view schematically illustrating a portion of the sub-zones of the first heater element according to the embodiment.

FIG. 6 is a plan view schematically illustrating a portion of the sub-zones of the first heater element according to the embodiment.

The sub-zone 700 includes the first heater line (the sub-heater line 231c) and a pair of first power feeding portions (a first sub-power feeding portion 231a and a second sub-power feeding portion 231b). The sub-heater line 231c is electrically connected to the first and second sub-power feeding portions 231a and 231b. The first sub-power feeding portion 231a is located at one end of the sub-heater line 231c; and the second sub-power feeding portion 231b is located at the other end of the sub-heater line 231c. For example, the first sub-power feeding portion 231a and the second sub-power feeding portion 231b each are electrically-conductive parts (metal films) that are wider than the sub-heater line 231c. The sub-heater line 231c is, for example, a relatively narrow electrically-conductive part (metal film). The sub-heater line 231c generates heat by allowing a current to flow. The first sub-power feeding portion 231a and the second sub-power feeding portion 231b feed power to the sub-heater line 231c. One sub-zone 700 includes one first sub-power feeding portion 231a, one second sub-power feeding portion 231b, and one sub-heater line 231c. The sub-zone 700 is a region including a continuous sub-heater line 231c connecting the first sub-power feeding portion 231a and the second sub-power feeding portion 231b.

The sub-heater lines 231c included in the sub-zones 700 are independent of each other. Accordingly, a different voltage can be applied to each sub-zone 700 (sub-heater line 231c). Accordingly, the output (the generated heat amount) can be controlled independently for each sub-zone 700. In other words, the sub-zones 700 are heater units capable of performing mutually-independent temperature control; and the first heater element 231 is an aggregate of heater units including multiple heater units.

Figure 7:
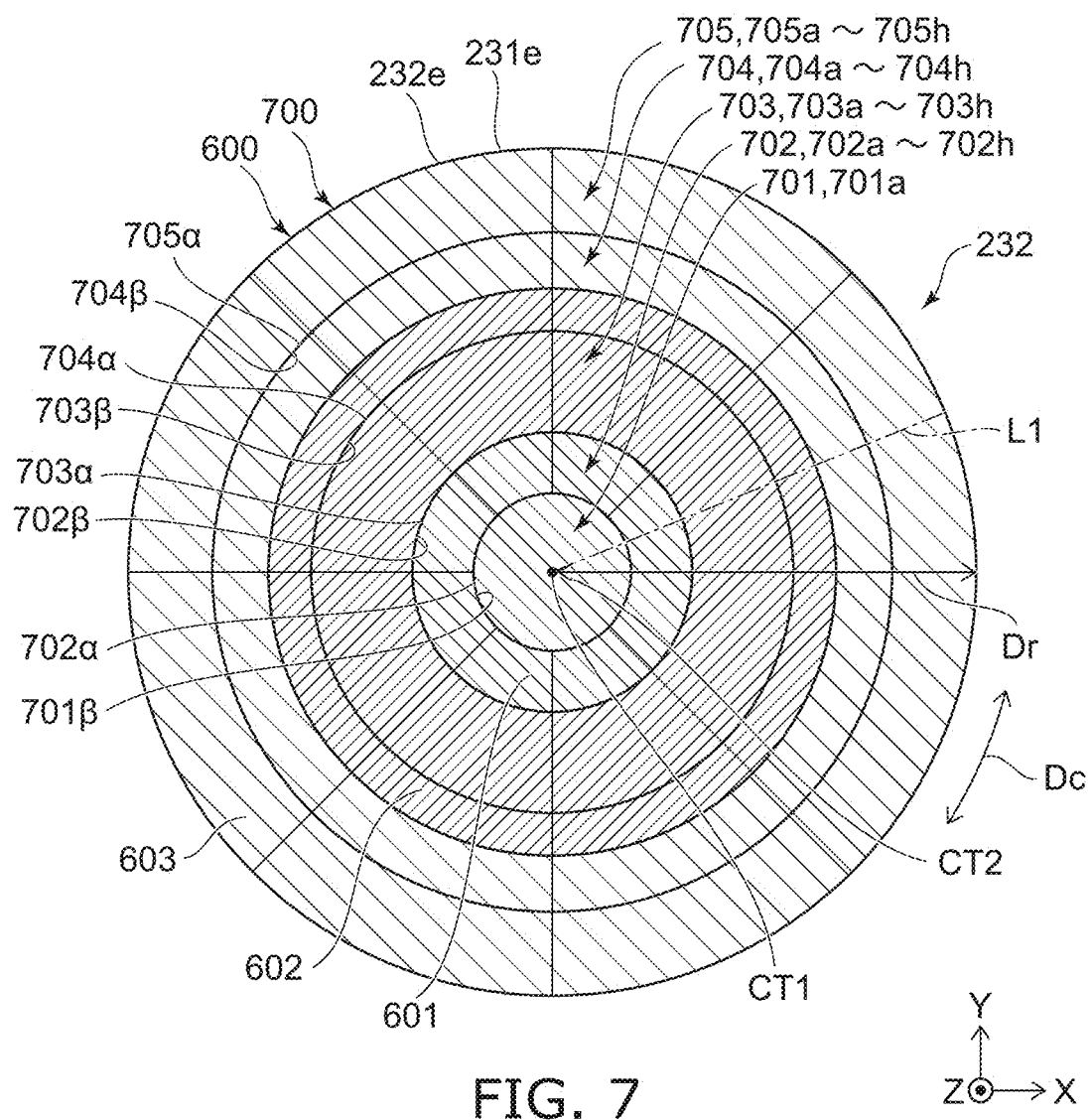
FIG. 7 is a plan view schematically illustrating the first heater element and the second heater element according to the embodiment.

FIG. 7 is a plan view schematically illustrating the first heater element and the second heater element according to the embodiment.

FIG. 7 is a view in which the second heater element 232 described with reference to FIG. 3 and the first heater element 231 described with reference to FIG. 5 are projected onto a plane perpendicular to the Z-direction.

For example, the first heater element 231 and the second heater element 232 are disposed so that the center CT1 of the first heater element 231 and the center CT2 of the second heater element 232 overlap in the Z-direction. In such a case, for example, an outer circumference edge 231e of the first heater element 231 and an outer circumference edge 232e of the second heater element 232 overlap in the Z-direction. For example, an outer circumference edge 701β of the first region 701 and an inner circumference edge 702α of the second region 702 each overlap the main zone 601 in the Z-direction. For example, an outer circumference edge 702β of the second region 702 and an inner circumference edge 703α of the third region 703 each overlap the main zone 601 or the main zone 602 in the Z-direction. For example, an outer circumference edge 703β of the third region 703 and an inner circumference edge 704α of the fourth region 704 each overlap the main zone 602 in the Z-direction. For example, an outer circumference edge 704β of the fourth region 704 and an inner circumference edge 705α of the fifth region 705 each overlap the main zone 603 in the Z-direction.

Figure 8:
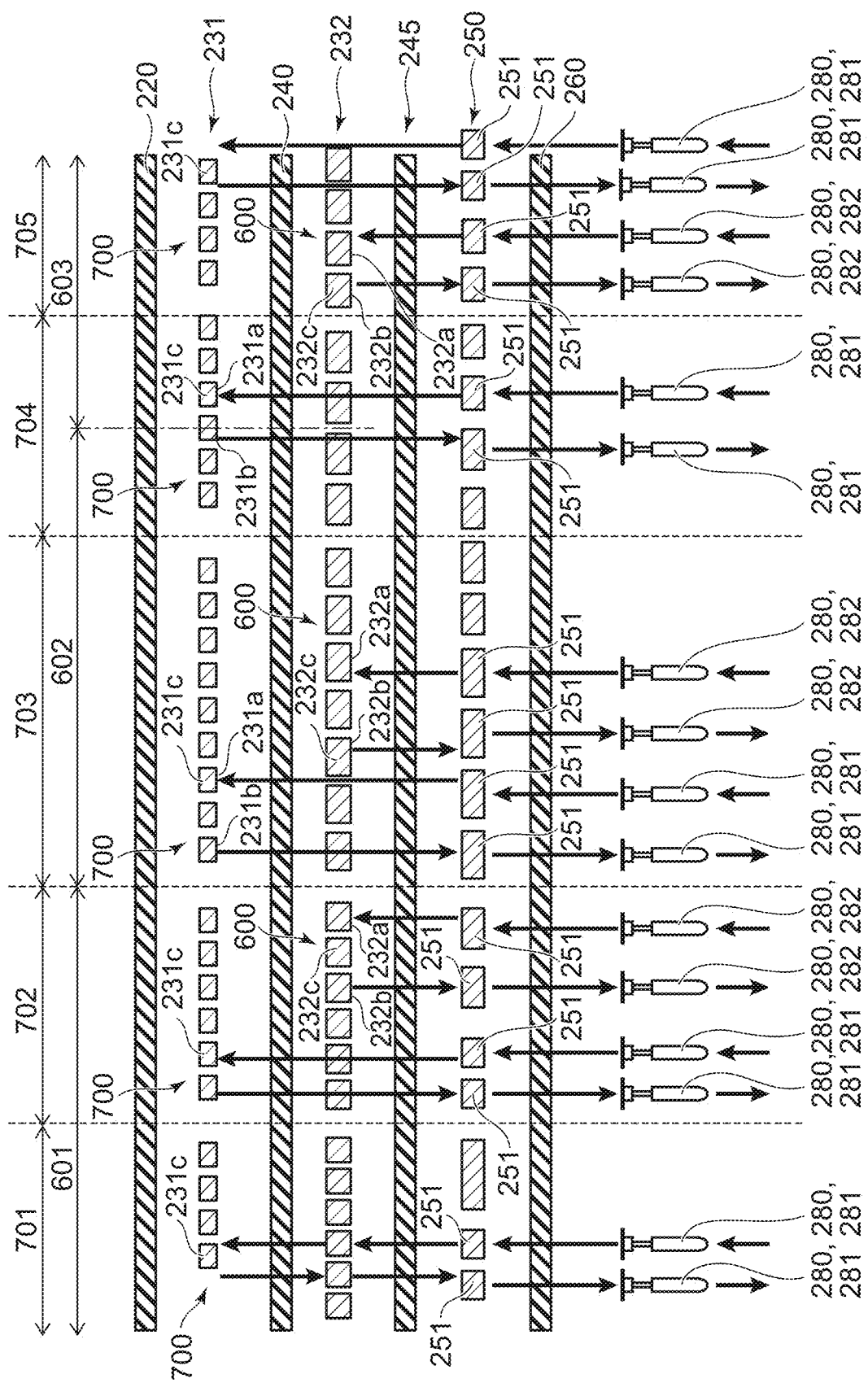
FIG. 8 is an exploded cross-sectional view schematically illustrating the heater unit according to the embodiment.

FIG. 8 is an exploded cross-sectional view schematically illustrating the heater unit according to the embodiment.

FIG. 8 corresponds to a cross section along line L1 shown in FIG. 7. In FIG. 8, as in FIGS. 2A and 2B, an example is described in which the heater unit 200 is located between the first major surface 101 and the second major surface 102 of the ceramic dielectric substrate 100. In the example, the heater unit 200 includes a first insulating layer 220, the first heater element 231, a second insulating layer 240, the second heater element 232, a third insulating layer 245, a bypass layer 250, a fourth insulating layer 260, and the power feeding terminal 280.

When the heater unit 200 is located between the ceramic dielectric substrate 100 and the base plate 300, the heater unit 200 may include a support plate positioned under the fourth insulating layer 260, and a support plate positioned on the first insulating layer 220. The support plates support the first insulating layer 220, the first heater element 231, the second insulating layer 240, the second heater element 232, the third insulating layer 245, the bypass layer 250, and the fourth insulating layer 260 with these components interposed. The support plates may function as soaking plates.

The first heater element 231 is located between the first insulating layer 220 and the fourth insulating layer 260. When the heater unit 200 is embedded in the ceramic dielectric substrate 100, the ceramic dielectric substrate 100 may also serve as the first insulating layer 220.

The second insulating layer 240 is located between the first heater element 231 and the fourth insulating layer 260. The second heater element 232 is located between the second insulating layer 240 and the fourth insulating layer 260. Thus, the second heater element 232 is located in a different layer from the layer in which the first heater element 231 is located. At least a portion of the second heater element 232 overlaps the first heater element 231 in the Z-direction. The third insulating layer 245 is located between the second heater element 232 and the fourth insulating layer 260. The bypass layer 250 is located between the third insulating layer 245 and the fourth insulating layer 260.

In other words, the first heater element 231 is provided between the first insulating layer 220 and the second insulating layer 240. In other words, the second heater element 232 is provided between the second insulating layer 240 and the third insulating layer 245. In other words, the bypass layer 250 is provided between the third insulating layer 245 and the fourth insulating layer 260.

The first heater element 231 is in contact with, for example, each of the first insulating layer 220 and the second insulating layer 240. The second heater element 232 is in contact with, for example, each of the second insulating layer 240 and the third insulating layer 245. The bypass layer 250 is in contact with, for example, each of the third insulating layer 245 and the fourth insulating layer 260.

The bypass layer 250 and the fourth insulating layer 260 are provided as necessary and are omissible. An example in which the heater unit 200 includes the bypass layer 250 and the fourth insulating layer 260 will now be described.

For example, an insulating material such as a resin, a ceramic, etc., can be used as the material of the first insulating layer 220. Polyimide, polyamideimide, etc., are examples when the first insulating layer 220 is a resin. $Al_2O_3$, AlN, SiC, $Y_2O_3$, YAG, etc., are examples when the first insulating layer 220 is a ceramic. The thickness (the Z-direction length) of the first insulating layer 220 is, for example, not less than about 0.01 mm and not more than about 0.20 mm. The first insulating layer 220 electrically insulates between the ceramic dielectric substrate 100 and the first heater element 231. Thus, the first insulating layer 220 has an electrical insulation function. The first insulating layer 220 may have other functions such as, for example, a heat conduction function, a diffusion prevention function, etc.

The material and thickness of the second insulating layer 240 are about the same as the material and thickness of the first insulating layer 220, respectively. The material and thickness of the third insulating layer 245 are about the same as the material and thickness of the first insulating layer 220, respectively. The material and thickness of the fourth insulating layer 260 are about the same as the material and thickness of the first insulating layer 220, respectively.

The second insulating layer 240 electrically insulates between the first heater element 231 and the second heater element 232. Thus, the second insulating layer 240 has an electrical insulation function. The second insulating layer 240 may have other functions such as, for example, a heat conduction function, a diffusion prevention function, etc.

The third insulating layer 245 electrically insulates between the second heater element 232 and the bypass layer 250. Thus, the third insulating layer 245 has an electrical insulation function. The third insulating layer 245 may have other functions such as, for example, a heat conduction function, a diffusion prevention function, etc.

The fourth insulating layer 260 electrically insulates between the bypass layer 250 and the ceramic dielectric substrate 100. Thus, the fourth insulating layer 260 has an electrical insulation function. The fourth insulating layer 260 may have other functions such as, for example, a heat conduction function, a diffusion prevention function, etc.

When the first heater element 231 is embedded in the ceramic dielectric substrate 100, for example, metals including at least one of titanium, chrome, nickel, copper, aluminum, molybdenum, tungsten, palladium, platinum, silver, tantalum, molybdenum carbide, or tungsten carbide, etc., are examples of the material of the first heater element 231. It is favorable for the material of the first heater element 231 to include a ceramic material and the metals described above. Aluminum oxide ($Al_2O_3$), yttrium oxide ($Y_2O_3$), yttrium aluminum garnet (YAG ($Y_3Al_5O_{12}$)), aluminum nitride (AlN), silicon carbide (SiC), etc., are examples of ceramic materials. It is favorable for the ceramic material included in the first heater element 231 to be the same as the components of the ceramic dielectric substrate 100. When the first heater element 231 is provided separately from the ceramic dielectric substrate 100, for example, metals including at least one of stainless steel, titanium, chrome, nickel, copper, aluminum, Inconel (registered trademark), molybdenum, tungsten, palladium, platinum, silver, tantalum, molybdenum carbide, or tungsten carbide, etc., are examples of the material of the first heater element 231. The thickness (the Z-direction length) of the first heater element 231 is, for example, not less than about 0.01 mm and not more than about 0.20 mm. The material and thickness of the second heater element 232 are respectively similar to the material and thickness of the first heater element 231. For example, the same materials as the materials of the first heater element 231 when the first heater element 231 is located inside the ceramic dielectric substrate 100 are examples of the material of the second heater element 232 when the second heater element 232 is located inside the ceramic dielectric substrate 100. For example, the same materials as the materials of the first heater element 231 when the first heater element 231 is located outside the ceramic dielectric substrate 100 are examples of the material of the second heater element 232 when the second heater element 232 is located outside the ceramic dielectric substrate 100. The material and thickness of the second heater element 232 may be different respectively from the material and thickness of the first heater element 231. For example, the first heater element 231 and the second heater element 232 each are electrically connected to the bypass layer 250. On the other hand, the first heater element 231 and the second heater element 232 each are electrically insulated from the ceramic dielectric substrate 100.

Each of the first heater element 231 and the second heater element 232 generates heat when the current flows. The first heater element 231 and the second heater element 232 heat the ceramic dielectric substrate 100 by generating heat. Since the first heater element 231 and the second heater element 232 heat the process object W through, for example, the ceramic dielectric substrate 100, the in-plane temperature distribution of the process object W is allowed to be uniform. Alternatively, by heating the process object W through, for example, the ceramic dielectric substrate 100, the first heater element 231 and the second heater element 232 may intentionally make a difference in the in-plane temperature of the process object W.

The bypass layer 250 is, for example, plate-shaped and electrically conductive. For example, the bypass layer 250 is electrically connected to the first and second heater elements 231 and 232. The bypass layer 250 is a power feeding path of the first and second heater elements 231 and 232. On the other hand, for example, the bypass layer 250 is electrically insulated from the ceramic dielectric substrate 100 by an insulating layer.

The bypass layer 250 includes multiple bypass portions 251. For example, two bypass portions 251 are electrically connected to one main zone 600; and two bypass portions 251 are electrically connected to one sub-zone 700. The two bypass portions 251 correspond to the inflow side of the current (the positive side of the voltage) and the outflow side of the current (the negative side of the voltage). In such a case, the number of the multiple bypass portions 251 is equal to 2 times the sum of the number of the multiple main zones 600 and the number of the multiple sub-zones 700 or less than 2 times the sum. However, the number of the bypass portions 251 is not limited thereto. One bypass portion 251 may be electrically connected to multiple main zones 600 or multiple sub-zones 700.

The thickness (length in the Z-direction) of the bypass layer 250 is, for example, not less than about 0.03 mm and not more than about 0.30 mm. The thickness of the bypass layer 250 is greater than that of the first insulating layer 220. The thickness of the bypass layer 250 is greater than that of the second insulating layer 240. The thickness of the bypass layer 250 is greater than that of the third insulating layer 245. The thickness of the bypass layer 250 is greater than that of the fourth insulating layer 260.

For example, when the bypass layer 250 is located outside the ceramic dielectric substrate 100, metals including at least one of stainless steel, titanium, chrome, nickel, copper, aluminum, Inconel (registered trademark), molybdenum, tungsten, palladium, platinum, silver, tantalum, molybdenum carbide, or tungsten carbide, etc., are examples of the material of the bypass layer 250. For example, when the heater unit 200 (the bypass layer 250, the first heater element 231, and the second heater element 232) is embedded in the ceramic dielectric substrate 100, the material of the bypass layer 250 is the same as the material of the first and second heater elements 231 and 232. On the other hand, the thickness of the bypass layer 250 is greater than the thickness of the first heater element 231 and greater than the thickness of the second heater element 232. Therefore, the electrical resistance of the bypass layer 250 is less than the electrical resistance of the first heater element 231 and less than the electrical resistance of the second heater element 232. Accordingly, heat generation by the bypass layer 250 in the manner of the first heater element 231 and the second heater element 232 can be suppressed even when the material of the bypass layer 250 is the same as the material of the first and second heater elements 231 and 232. That is, the electrical resistance of the bypass layer 250 can be reduced, and the generated heat amount of the bypass layer 250 can be reduced.

The technique of reducing the electrical resistance of the bypass layer 250 and reducing the generated heat amount of the bypass layer 250 may be realized by using a material having a relatively low volume resistivity instead of using the thickness of the bypass layer 250. In other words, the material of the bypass layer 250 may be a different material from the first and second heater elements 231 and 232. For example, metals including at least one of stainless steel, titanium, chrome, nickel, copper, aluminum, Inconel (registered trademark), molybdenum, tungsten, palladium, platinum, silver, tantalum, molybdenum carbide, or tungsten carbide, etc., are examples of the material of the bypass layer 250.

For example, when the bypass layer 250 is located inside the ceramic dielectric substrate 100, the same materials as the materials of the first heater element 231 when the first heater element 231 is located inside the ceramic dielectric substrate 100 are examples of the material of the bypass layer 250. For example, when the bypass layer 250 is located outside the ceramic dielectric substrate 100, the same materials as the materials of the first heater element 231 when the first heater element 231 is located outside the ceramic dielectric substrate 100 are examples of the material of the bypass layer 250.

The heater unit 200 includes the multiple power feeding terminals 280. The power feeding terminals 280 are electrically connected to the bypass layer 250. The power feeding terminals 280 are provided from the heater unit 200 toward the base plate 300 in the state in which the heater unit 200 is embedded in the ceramic dielectric substrate 100. The power feeding terminals 280 supply the power supplied from outside the electrostatic chuck 10 to the first and second heater elements 231 and 232 via the bypass layer 250. For example, the power feeding terminals 280 may be directly connected to the first and second heater elements 231 and 232. The bypass layer 250 is omissible thereby. The shape of the power feeding terminal 280 is not particularly limited, and it is sufficient for the power feeding terminal 280 to be an electrically-conductive part electrically connected directly or indirectly to at least one of the first heater element 231 or the second heater element 232.

On the other hand, when the first heater element 231 and/or the second heater element 232 includes many zones, e.g., not less than 20, not less than 50, or not less than 100, there are cases where it is difficult to dispose the power feeding terminals 280 corresponding to each zone. By providing the bypass layer 250, the layout degree of freedom of the power feeding terminals 280 is increased compared to when the power feeding terminals 280 are disposed for each zone.

For example, one power feeding terminal 280 is electrically connected to one bypass portion 251. For example, the number of the power feeding terminals 280 is equal to the number of the bypass portions 251.

The first heater element 231 is electrically connected to the bypass layer 250 at the first and second sub-power feeding portions 231a and 231b.

The multiple power feeding terminals 280 include the multiple sub-power feeding terminals 281 (first power feeding terminals) for feeding power to the multiple sub-zones 700. For example, two sub-power feeding terminals 281 are electrically connected to one sub-zone 700 via the bypass layer 250. One of the two sub-power feeding terminals 281 is electrically connected to the first sub-power feeding portion 231a included in one sub-zone 700; and the other of the two sub-power feeding terminals 281 is electrically connected to the second sub-power feeding portion 231b included in the one sub-zone 700.

The current from the outside flows from one sub-power feeding terminal 281 of the two sub-power feeding terminals 281 via the bypass portion 251 through one sub-zone 700 (from the first sub-power feeding portion 231a to the second sub-power feeding portion 231b via the sub-heater line 231c). The current that flows through the one sub-zone 700 flows to the outside via another bypass portion 251 and the other sub-power feeding terminal 281 of the two sub-power feeding terminals 281.

Thus, one of a pair of first power feeding portions (the first sub-power feeding portion 231a and the second sub-power feeding portion 231b) included in one sub-zone 700 is electrically connected to one of the multiple sub-power feeding terminals 281. That is, the pair of first power feeding portions is electrically connected respectively to two sub-power feeding terminals 281 of the multiple sub-power feeding terminals 281. The multiple first power feeding portions are electrically connected respectively to the multiple sub-power feeding terminals 281. For example, the number of the multiple sub-power feeding terminals 281 is not less than the number of the sub-zones 700. As an example, the number of the multiple sub-power feeding terminals 281 is 2 times the number of the sub-zones 700.

However, one sub-power feeding terminal 281 may be electrically connected to multiple first power feeding portions belonging to different sub-zones 700 via the bypass layer 250. In such a case, the number of the multiple sub-power feeding terminals 281 may be equal to or less than 2 times the number of the sub-zones 700.

The second heater element 232 is electrically connected to the bypass layer 250 at the first and second main power feeding portions 232a and 232b.

The multiple power feeding terminals 280 include the multiple main power feeding terminals 282 (second power feeding terminals) for feeding power to the multiple main zones 600. For example, two main power feeding terminals 282 are electrically connected to one main zone 600 via the bypass layer 250. One of the two main power feeding terminals 282 is electrically connected to the first main power feeding portion 232a included in one main zone 600; and the other of the two main power feeding terminals 282 is electrically connected to the second main power feeding portion 232b included in the one main zone 600.

The current from the outside flows from one main power feeding terminal 282 of the two main power feeding terminals 282 via the bypass portion 251 through one main zone 600 (from the first main power feeding portion 232a to the second main power feeding portion 232b via the main heater line 232c). The current that flows through the one main zone 600 flows to the outside via another bypass portion 251 and the other main power feeding terminal 282 of the two main power feeding terminals 282.

Thus, one of a pair of second power feeding portions (the first main power feeding portion 232a and the second main power feeding portion 232b) included in one main zone 600 is electrically connected to one of the multiple main power feeding terminals 282. That is, the pair of second power feeding portions is electrically connected respectively to two main power feeding terminals 282 of the multiple main power feeding terminals 282. The multiple second power feeding portions are electrically connected respectively to the multiple main power feeding terminals 282. For example, the number of the multiple main power feeding terminals 282 is not more than the number of the main zones 600, and as an example, is 2 times the number of the main zones 600.

However, one main power feeding terminal 282 may be electrically connected to multiple second power feeding portions belonging to different main zones 600 via the bypass layer 250. In such a case, the number of the multiple main power feeding terminals 282 may be equal to or less than 2 times the number of the main zones 600.

For example, the current flowing in the first heater element 231 and the current flowing in the second heater element 232 are separately controlled. In the example, the bypass portions 251 connected to the first heater element 231 (the first sub-power feeding portion 231a and the second sub-power feeding portion 231b) and the bypass portions 251 connected to the second heater element 232 (the first main power feeding portion 232a and the second main power feeding portion 232b) are different from each other. The bypass portions 251 connected to the first heater element 231 (the first sub-power feeding portion 231a and the second sub-power feeding portion 231b) and the bypass portions 251 connected to the second heater element 232 (the first main power feeding portion 232a and the second main power feeding portion 232b) may be the same.

The first heater element 231 generates a smaller heat amount than the second heater element 232. That is, the first heater element 231 is a low power sub-heater, and the second heater element 232 is a high power main heater.

Thus, the first heater element 231 is allowed to generate a smaller heat amount than the second heater element 232, so that the in-plane temperature unevenness of the process object W caused by the pattern of the second heater element 232 can be suppressed by the first heater element 231. Therefore, the uniformity of the in-plane temperature distribution of the process object W can be improved.

The volume resistivity of the first heater element 231 is, for example, greater than the volume resistivity of the second heater element 232. The volume resistivity of the first heater element 231 is the volume resistivity of the sub-heater line 231c. That is, the volume resistivity of the first heater element 231 is the volume resistivity between the first sub-power feeding portion 231a and the second sub-power feeding portion 231b. Similarly, the volume resistivity of the second heater element 232 is the volume resistivity of the main heater line 232c. That is, the volume resistivity of the second heater element 232 is the volume resistivity between the first main power feeding portion 232a and the second main power feeding portion 232b.

Thus, the volume resistivity of the first heater element 231 is allowed to be higher than the volume resistivity of the second heater element 232, so that the output (generated heat amount, power consumption) of the first heater element 231 can be allowed to be lower than the output (generated heat amount, power consumption) of the second heater element 232. Accordingly, the in-plane temperature unevenness of the process object caused by the pattern of the second heater element can be suppressed by the first heater element. Therefore, the uniformity of the in-plane temperature distribution of the process object can be improved.

Temperature singularities (points where the temperatures are relatively significantly different from the surrounding regions) tend to occur around the power feeding terminals 280. In contrast, by providing the bypass layer 250, the degree of freedom in arranging the power feeding terminals 280 can be increased. For example, the power feeding terminals 280 that tend to have temperature singularities can be arranged in a dispersed manner, so that the heat is easily diffused around the singularities. The uniformity of the in-plane temperature distribution of the process object W can be increased thereby.

The bypass layer 250 is provided, so that the power feeding terminal 280 having a large heat capacity can be configured not to be directly connected to the first heater element 231 and the second heater element 232. Accordingly, the uniformity of the in-plane temperature distribution of the process object W can be improved. The bypass layer 250 is provided, so that the power feeding terminal 280 may not be necessarily connected directly to the relatively thin first heater element 231 and the second heater element 232. Accordingly, the reliability of the heater unit 200 can be improved.

As described above, the power feeding terminal 280 is provided from the heater unit 200 toward the base plate 300. Power can be supplied from the side of the lower surface 303 (see FIGS. 2A and 2B) of the base plate 300 to the power feeding terminal 280 via a member called a socket or the like. Accordingly, the wiring of the heater is implemented while suppressing exposure of the power feeding terminal 280 in the chamber in which the electrostatic chuck 10 is installed.

In the example, the first heater element 231 is located above the second heater element 232. In other words, the first heater element 231 is provided between the second heater element 232 and the first major surface 101. The position of the first heater element 231 and the position of the second heater element 232 may be opposite to each other. That is, the second heater element 232 may be located above the first heater element 231. In other words, the second heater element 232 may be provided between the first major surface 101 and the first heater element 231. From the viewpoint of temperature control, it is favorable that the first heater element 231 is located above the second heater element 232.

When the first heater element 231 is located above the second heater element 232, the distance between the first heater element 231 and the process object W is shorter than the distance between the second heater element 232 and the process object W. Since the first heater element 231 is relatively close to the process object W, the temperature of the process object W can be easily controlled by the first heater element 231. That is, the in-plane temperature unevenness of the process object W caused by the pattern of the second heater element 232 can be easily suppressed by the first heater element 231. Therefore, the uniformity of the in-plane temperature distribution of the process object W can be improved.

On the other hand, when the second heater element 232 is located above the first heater element 231, the high power second heater element 232 is relatively close to the process object W. Accordingly, it is possible to improve the temperature responsiveness (temperature raising rate/temperature lowering rate) of the process object W.

In the example, the second heater element 232 is provided between the bypass layer 250 and the first heater element 231 in the Z-direction. That is, the bypass layer 250 is located below the first heater element 231 and the second heater element 232.

Thus, since the second heater element 232 is provided between the bypass layer 250 and the first heater element 231 in the Z-direction, the first heater element 231 and the second heater element 232 can be disposed on one side of the bypass layer 250. Accordingly, when the power feeding terminal 280 is connected to the bypass layer 250, the power feeding terminal 280 can be connected to the bypass layer 250 from the side opposite to the first heater element 231 and the second heater element 232. Therefore, a hole part for passing the power feeding terminal 280 in the first heater element 231 or the second heater element 232 does not need to be provided, and the number of temperature singularities on the heater pattern can be reduced, so that the uniformity of the in-plane temperature distribution of the first heater element 231 or the second heater element 232 can be improved.

The bypass layer 250 may be positioned higher than the first and second heater elements 231 and 232. The bypass layer 250 may be positioned between the first heater element 231 and the second heater element 232.

The number of heater elements included in the heater unit 200 is not limited to "two". That is, the heater unit 200 may further have another heater element provided in a layer different from the first heater element 231 and the second heater element 232.

Figure 9:
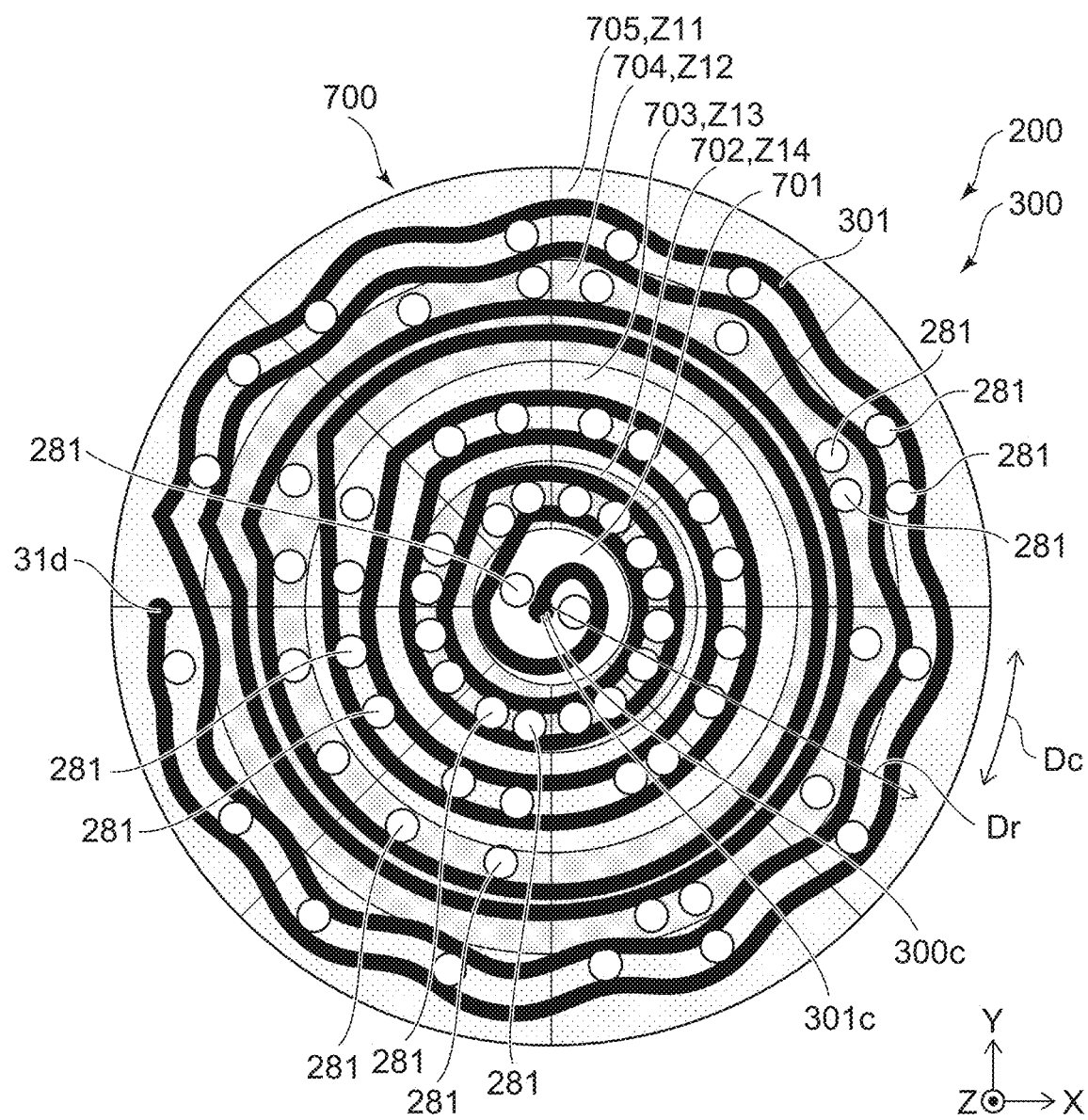
FIG. 9 is a plan view schematically illustrating a portion of the base plate and the heater unit according to the embodiment.
Figure 10:
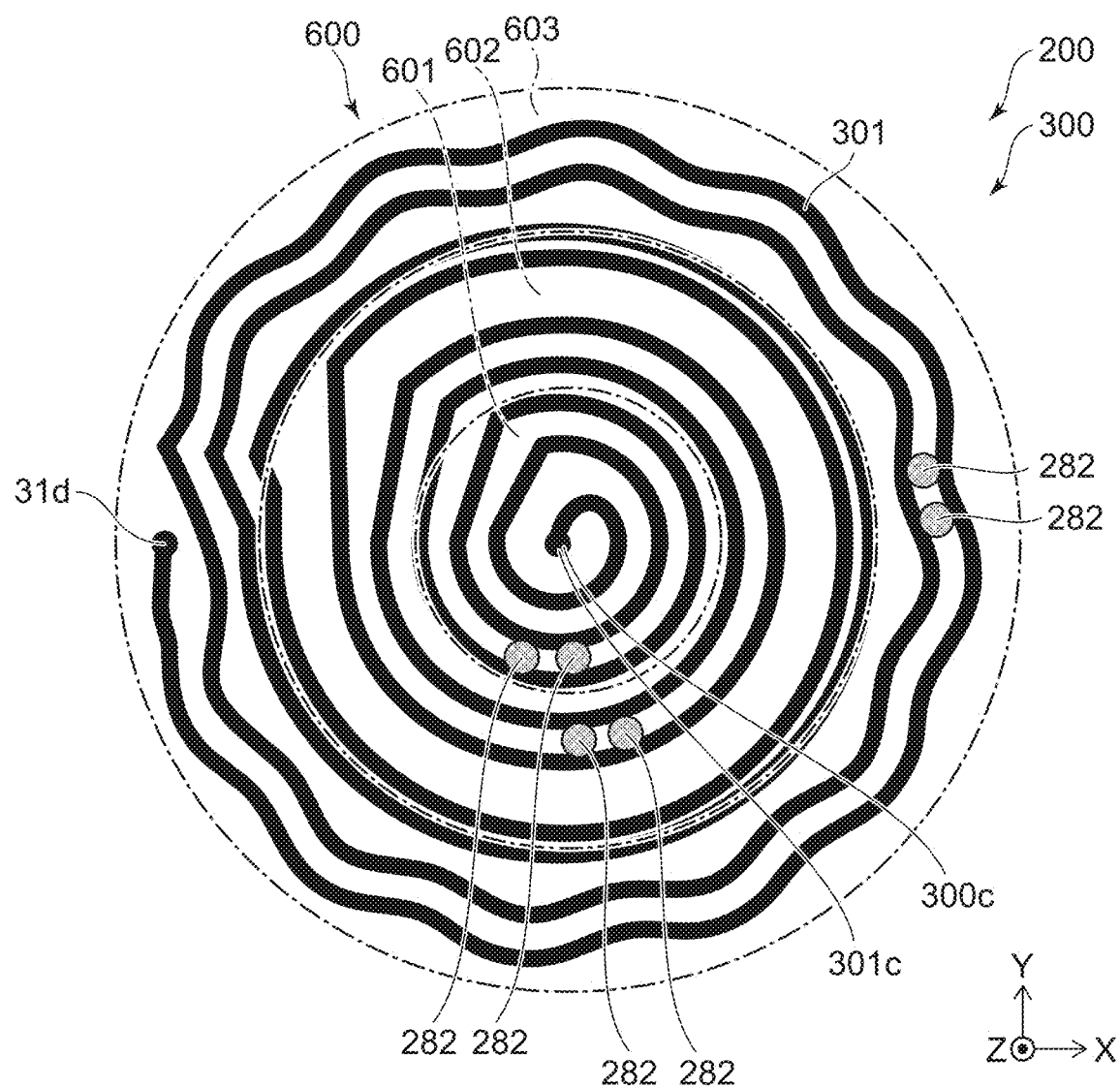
FIG. 10 is a plan view schematically illustrating a portion of the base plate and the heater unit according to the embodiment.
Figure 11:
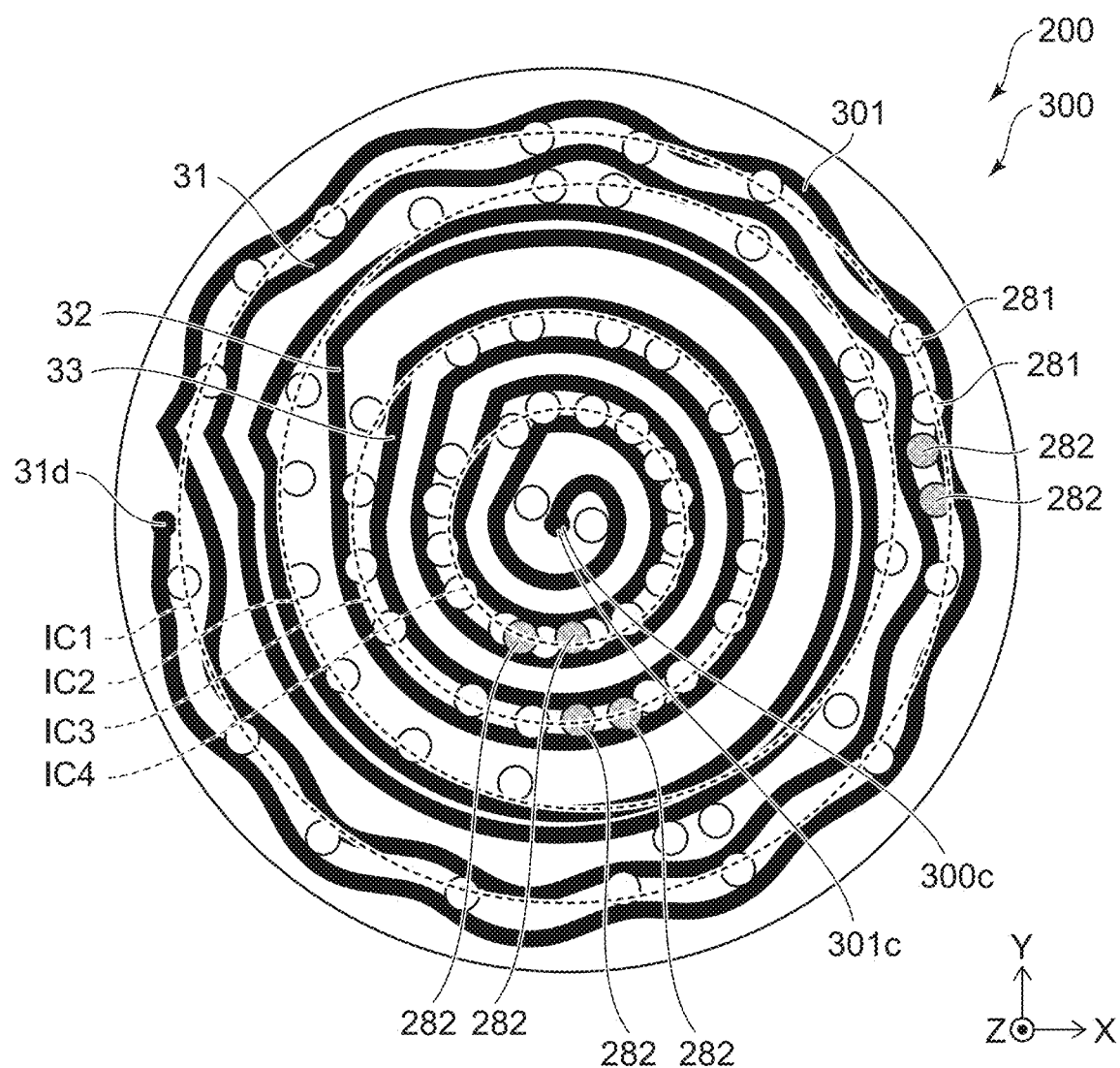
FIG. 11 is a plan view schematically illustrating a portion of the base plate and the heater unit according to the embodiment.

FIGS. 9 to 11 are plan views schematically illustrating portions of the base plate and the heater unit according to the embodiment.

FIG. 9 is a view in which the communicating path 301, the multiple sub-power feeding terminals 281, and the multiple sub-zones 700 of the base plate 300 are projected onto a plane perpendicular to the Z-direction.

FIG. 10 is a view in which the communicating path 301, the multiple main power feeding terminals 282, and the multiple main zones 600 of the base plate 300 are projected onto a plane perpendicular to the Z-direction.

FIG. 11 is a view in which the communicating path 301, the multiple sub-power feeding terminals 281, and the multiple main power feeding terminals 282 of the base plate 300 are projected onto a plane perpendicular to the Z-direction.

The planar shape of the base plate 300 is, for example, circular. The scope of circular includes not only perfectly circular but also substantially circular. One end 301c of the communicating path 301 is positioned at a center 300c vicinity of the planar shape of the base plate 300. Another end 31d of the communicating path 301 is positioned at the outer circumference portion of the planar shape of the base plate 300. The communicating path 301 has a spiral shape connecting the one end 301c and the other end 31d when viewed along the stacking direction. For example, a coolant flows into the communicating path 301 through the one end 301c, flows through the spiral-shaped communicating path 301, and flows out of the communicating path 301 through the other end 31d.

For example, the communicating path 301 is a one-stroke spiral shape. In other words, the shape of the communicating path 301 separates from the center 300c while revolving along the circumferential direction around the center 300c when viewed along the stacking direction. However, a portion of the "spiral shape" may extend to approach the center 300c. A portion of the "spiral shape" may meander. A portion of the "spiral shape" may extend linearly.

In the example as illustrated in FIG. 9, one sub-zone 700 overlaps, in the Z-direction, two sub-power feeding terminals 281 feeding power to the one sub-zone 700.

In the example as illustrated in FIG. 10, one main zone 600 overlaps, in the Z-direction, two main power feeding terminals 282 feeding power to the one main zone 600.

For example, in the plan views of FIG. 11, etc., a portion of the main power feeding terminals 282 is displayed as overlapping a portion of sub-power feeding terminals 281. However, the main power feeding terminals 282 may not overlap the sub-power feeding terminals 281. The sizes of the terminals, etc., may be adjusted as appropriate.

Figure 12:
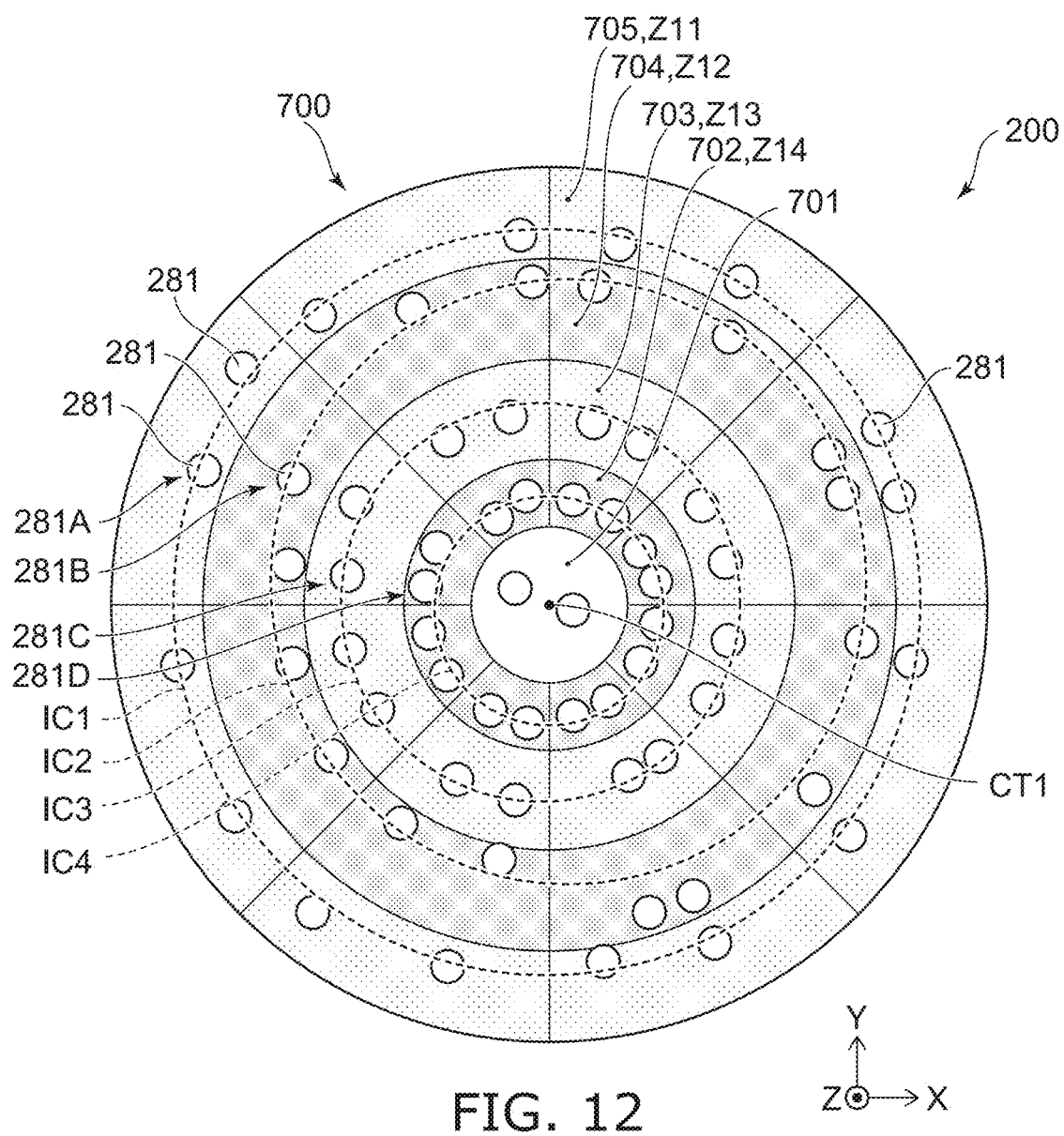
FIG. 12 is a plan view schematically illustrating a portion of the heater unit according to the embodiment.
Figure 13:
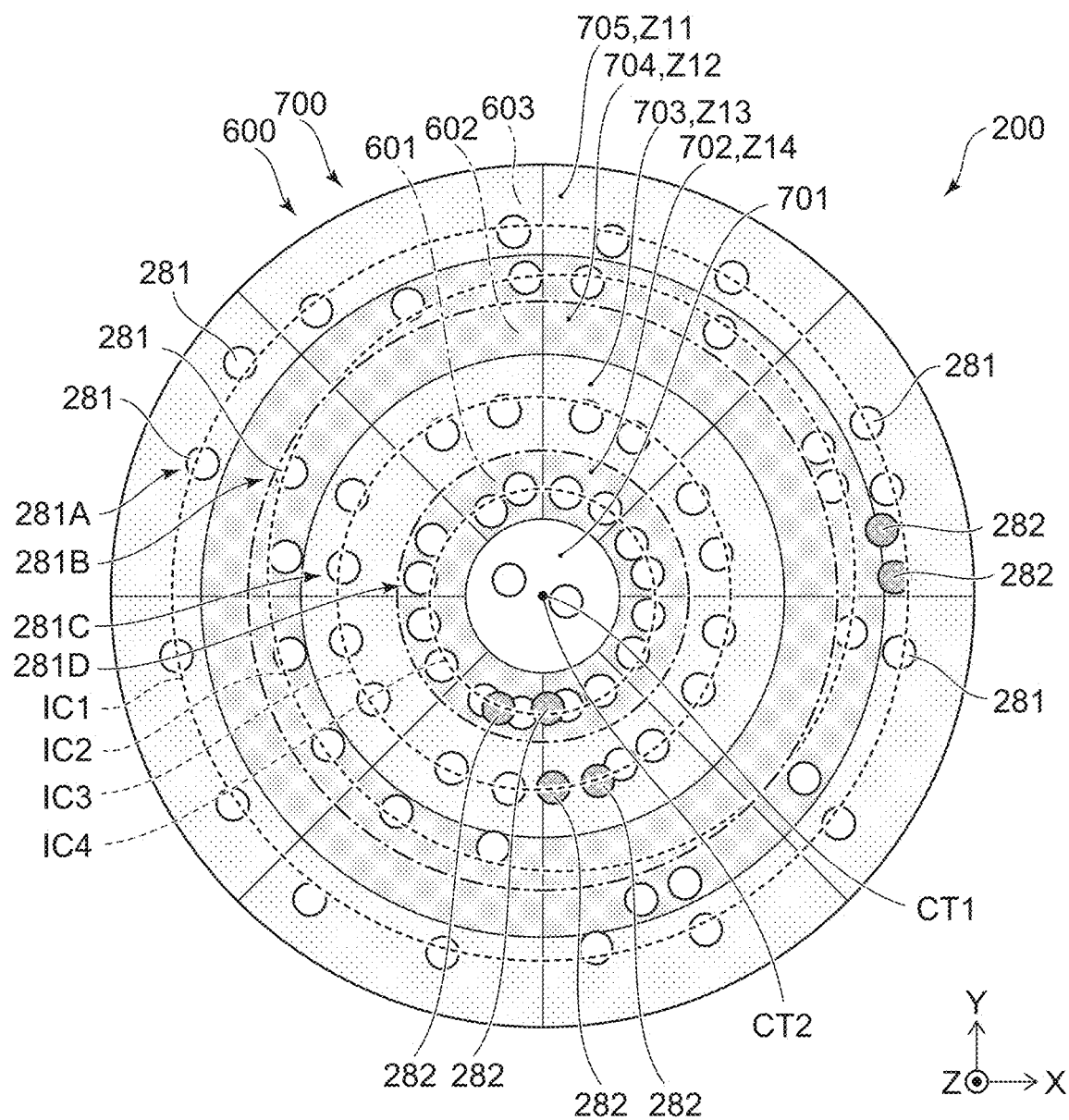
FIG. 13 is a plan view schematically illustrating a portion of the heater unit according to the embodiment.

FIGS. 12 and 13 are plan views schematically illustrating a portion of the heater unit according to the embodiment.

FIG. 12 is a view in which the multiple sub-power feeding terminals 281 and the multiple sub-zones 700 are projected onto a plane perpendicular to the Z-direction.

FIG. 13 is a view in which the multiple sub-power feeding terminals 281, the multiple main power feeding terminals 282, the multiple sub-zones 700, and the multiple main zones 600 are projected onto a plane perpendicular to the Z-direction.

The multiple sub-power feeding terminals 281 include a first annular portion 281A, a second annular portion 281B, a third annular portion 281C, and a fourth annular portion 281D. The first to fourth annular portions 281A to 281D each are groups of multiple sub-power feeding terminals 281.

The first annular portion 281A includes a portion of sub-power feeding terminals 281 among the multiple sub-power feeding terminals 281. The portion of sub-power feeding terminals 281 included in the first annular portion 281A is disposed on a first virtual circle IC1 when viewed in plan. In other words, portions of the sub-power feeding terminals 281 included in the first annular portion 281A overlap the portions of the first virtual circle IC1 in the Z-direction. The number of the portion of sub-power feeding terminals 281 included in the first annular portion 281A is at least seven, and in the example, is sixteen.

The second annular portion 281B includes another portion of sub-power feeding terminals 281 among the multiple sub-power feeding terminals 281 that is different from the sub-power feeding terminals 281 included in the first annular portion 281A. The other portion of sub-power feeding terminals 281 included in the second annular portion 281B is disposed on a second virtual circle IC2 when viewed in plan. In other words, portions of the sub-power feeding terminals 281 included in the second annular portion 281B overlap portions of the second virtual circle IC2 in the Z-direction. The number of the other portion of sub-power feeding terminals 281 included in the second annular portion 281B is at least seven, and in the example, is twelve.

The third annular portion 281C includes another portion of sub-power feeding terminals 281 among the multiple sub-power feeding terminals 281 that is different from the sub-power feeding terminals 281 included in the first and second annular portions 281A and 281B. The other portion of sub-power feeding terminals 281 included in the third annular portion 281C is disposed on a third virtual circle IC3 when viewed in plan. In other words, portions of the sub-power feeding terminals 281 included in the third annular portion 281C overlap portions of the third virtual circle IC3 in the Z-direction. The number of the other portion of sub-power feeding terminals 281 included in the third annular portion 281C is at least seven, and in the example, is sixteen.

The fourth annular portion 281D includes another portion of sub-power feeding terminals 281 among the multiple sub-power feeding terminals 281 that is different from the sub-power feeding terminals 281 included in the first annular portion 281A, the second annular portion 281B, and the third annular portion 281C. The other portion of sub-power feeding terminals 281 included in the fourth annular portion 281D is disposed on a fourth virtual circle IC4 when viewed in plan. In other words, portions of the sub-power feeding terminals 281 included in the fourth annular portion 281D overlap portions of the fourth virtual circle IC4 in the Z-direction. The number of the other portion of sub-power feeding terminals 281 included in the fourth annular portion 281D is at least seven, and in the example, is sixteen.

When viewed in plan, the second virtual circle IC2 is positioned inward of the first virtual circle IC1; the third virtual circle IC3 is positioned inward of the second virtual circle IC2; the fourth virtual circle IC4 is positioned inward of the third virtual circle IC3; and the center CT1 of the first heater element 231 is positioned inward of the fourth virtual circle IC4.

When viewed in plan, the second annular portion 281B is positioned inward of the first annular portion 281A. In other words, the distance between the center CT1 and the sub-power feeding terminals 281 included in the second annular portion 281B is less than the distance between the center CT1 and the sub-power feeding terminals 281 included in the first annular portion 281A.

When viewed in plan, the third annular portion 281C is positioned inward of the second annular portion 281B. In other words, the distance between the center CT1 and the sub-power feeding terminals 281 included in the third annular portion 281C is less than the distance between the center CT1 and the sub-power feeding terminals 281 included in the second annular portion 281B.

When viewed in plan, the fourth annular portion 281D is positioned inward of the third annular portion 281C. In other words, the distance between the center CT1 and the sub-power feeding terminals 281 included in the fourth annular portion 281D is less than the distance between the center CT1 and the sub-power feeding terminals 281 included in the third annular portion 281C.

In the example, the first virtual circle IC1 overlaps the fifth region 705 in the Z-direction. For example, the sub-power feeding terminals 281 included in the first annular portion 281A are electrically connected to the sub-zones 700 included in the fifth region 705 (the first annular zone region Z11) and feed power to the sub-zones 700 included in the fifth region 705.

In the example, the second virtual circle IC2 overlaps the fourth region 704 in the Z-direction. For example, the sub-power feeding terminals 281 included in the second annular portion 281B are electrically connected to the sub-zones 700 included in the fourth region 704 (the second annular zone region Z12) and feed power to the sub-zones 700 included in the fourth region 704.

In the example, the third virtual circle IC3 overlaps the third region 703 in the Z-direction. For example, the sub-power feeding terminals 281 included in the third annular portion 281C are electrically connected to the sub-zones 700 included in the third region 703 (the third annular zone region Z13) and feed power to the sub-zones 700 included in the third region 703.

In the example, the fourth virtual circle IC4 overlaps the second region 702 in the Z-direction. For example, the sub-power feeding terminals 281 included in the fourth annular portion 281D are electrically connected to the sub-zones 700 included in the second region 702 (the fourth annular zone region Z14) and feed power to the sub-zones 700 included in the second region 702.

As illustrated in FIG. 11, the communicating path 301 includes a first circumferential portion 31, a second circumferential portion 32, and a third circumferential portion 33. The first circumferential portion 31, the second circumferential portion 32, and the third circumferential portion 33 each are circular (substantially circular) flow paths when viewed in plan. Here, "circular (substantially circular)" is not a closed annular shape, but is a portion of a spiral shape.

The first circumferential portion 31 is positioned between the first virtual circle IC1 (the first annular portion 281A) and the second virtual circle IC2 (the second annular portion 281B) when viewed along the Z-direction (when projected onto the X-Y plane). The first circumferential portion 31 surrounds the second virtual circle IC2 (the second annular portion 281B) when viewed along the Z-direction. That is, the first circumferential portion 31 makes substantially one turn (e.g., about 300 to 340°) around the second virtual circle IC2 (the second annular portion 281B). The first circumferential portion 31 may make one or more turns (e.g., 2 to 3 turns) around the second virtual circle IC2.

The second circumferential portion 32 is positioned between the second virtual circle IC2 (the second annular portion 281B) and the third virtual circle IC3 (the third annular portion 281C) when viewed along the Z-direction. The second circumferential portion 32 surrounds the third virtual circle IC3 (the third annular portion 281C) when viewed along the Z-direction. That is, the second circumferential portion 32 makes substantially one turn (e.g., about 300 to 340°) around the third virtual circle IC3 (the third annular portion 281C). The second circumferential portion 32 may make one or more turns (e.g., 2 to 3 turns) around the third virtual circle IC3.

The third circumferential portion 33 is positioned between the third virtual circle IC3 (the third annular portion 281C)

and the fourth virtual circle IC4 (the fourth annular portion 281D) when viewed along the Z-direction. The third circumferential portion 33 surrounds the fourth virtual circle IC4 (the fourth annular portion 281D) when viewed along the Z-direction. That is, the third circumferential portion 33 makes substantially one turn (e.g., about 300 to 340°) around the fourth virtual circle IC4 (the fourth annular portion 281D). The third circumferential portion 33 may make one or more turns (e.g., 2 to 3 turns) around the fourth virtual circle IC4.

In the example, the communicating path 301 extends in the circumferential direction Dc while meandering in the radial direction Dr at the outer circumference portion of the spiral shape. Therefore, the first circumferential portion 31 extends in the circumferential direction Dc while meandering. The first circumferential portion 31, the second circumferential portion 32, and the third circumferential portion 33 each may or may not meander.

As described above, the temperature of the process object is controlled by heating by the heater unit 200 and by cooling by the coolant flowing through the communicating path 301. Also, there are cases where, for example, heat is input to the process object W from plasma, etc. As described above with reference to FIGS. 2A and 2B, the terminal hole 300p that corresponds to the position of the power feeding terminal 280 (or a wiring part or the like connected to the power feeding terminal 280) is provided in the base plate 300 for disposing the power feeding terminal 280. The communicating path 301 (the coolant flow path) of the base plate 300 is positioned to avoid the terminal hole 300p. That is, the coolant flow path does not exist at the portions at which the terminal holes 300p are provided. Therefore, the regions of the placement surface of the ceramic dielectric substrate 100 positioned above the terminal holes 300p are difficult to cool and may become hotspots having higher temperatures than the other regions. For example, when the power feeding terminals 280 are randomly arranged in the plane, the hotspots are randomly arranged, and, for example, hot/cool fluctuation (fluctuation of the temperature distribution) occurs in the circumferential direction. As a result, there is a risk that the uniformity of the in-plane temperature distribution of the process object W may degrade. For example, the fluctuation of the plasma distribution increases according to the arrangement of the power feeding terminals 280.

In contrast, according to the embodiment, not less than twenty of the sub-zones 700 are included; the multiple sub-power feeding terminals 281 include the first annular portion 281A and the second annular portion 281B; and the first circumferential portion 31 of the communicating path 301 is disposed between the first annular portion 281A and the second annular portion 281B when viewed in plan. The temperature unevenness in the radial direction and circumferential direction caused by the positions of the sub-power feeding terminals 281 can be suppressed thereby, and the uniformity of the in-plane temperature distribution of the process object can be increased. For example, a portion of the temperature unevenness (e.g., the hotspots) formed by the first and second annular portions 281A and 281B cancels with a portion of the temperature unevenness (e.g., the cool spots) formed by the first circumferential portion 31. As a result, the temperature distribution can approach being substantially uniform; and unfavorable effects on the plasma distribution can be reduced.

For example, the number of the sub-zones 700 included in the first annular zone region Z11 (the fifth region 705) is taken as N1. The number of the sub-power feeding terminals 281 included in the first annular portion 281A is greater than $2 \times N1 \times 0.6$ and not more than $2 \times N1$. Accordingly, for example, more than 60% of the sub-power feeding terminals 281 feeding power to the multiple sub-zones 700 included in the first annular zone region Z11 is included in the first annular portion 281A. The uniformity of the in-plane temperature distribution can be further improved thereby. In the example, N1 is 8, and the number of the sub-power feeding terminals 281 included in the first annular portion 281A is not less than 10 and not more than 16.

For example, the number of the sub-zones 700 included in the second annular zone region Z12 (the fourth region 704) is taken as N2. The number of the sub-power feeding terminals 281 included in the second annular portion 281B is greater than $2 \times N2 \times 0.6$ and not more than $2 \times N2$.

For example, the number of the sub-zones 700 included in the third annular zone region Z13 (the third region 703) is taken as N3. The number of the sub-power feeding terminals 281 included in the third annular portion 281C is greater than $2 \times N3 \times 0.6$ and not more than $2 \times N3$.

For example, the number of the sub-zones 700 included in the fourth annular zone region Z14 (the second region 702) is taken as N4. The number of the sub-power feeding terminals 281 included in the fourth annular portion 281D is greater than $2 \times N4 \times 0.6$ and not more than $2 \times N4$.

At least a portion of the multiple main power feeding terminals 282 overlaps at least one of the first virtual circle IC1 or the second virtual circle IC2 when viewed along the Z-direction. The temperature unevenness caused by the positions of the main power feeding terminals 282 can be suppressed thereby, and the uniformity of the in-plane temperature distribution can be increased. For example, a portion of the temperature distribution (e.g., the hotspots) formed by the main power feeding terminals 282 cancels with a portion of the temperature distribution (e.g., the cool spots) formed by the first circumferential portion 31. Specifically, as illustrated in FIG. 11, the two main power feeding terminals 282 that feed power to the main zone 603 overlap the first virtual circle IC1 in the Z-direction. The two main power feeding terminals 282 that feed power to the main zone 602 overlap the third virtual circle IC3 in the Z-direction. The two main power feeding terminals 282 that feed power to the main zone 601 overlap the fourth virtual circle IC4 in the Z-direction.

As described above, the number of the multiple sub-zones 700 is greater than the number of the multiple main zones 600. Because the number of the sub-zones 700 is relatively large, for example, the number of the sub-power feeding terminals 281 is greater than the number of the main power feeding terminals 282. In such a case, the effects of the temperature unevenness due to the sub-power feeding terminals 281 may be greater than the effects of the temperature unevenness due to the main power feeding terminals 282. In contrast, the sub-power feeding terminals 281 include the first annular portion 281A and the second annular portion 281B; and the first circumferential portion 31 of the coolant flow path is disposed between the first annular portion 281A and the second annular portion 281B when viewed in plan. The temperature unevenness in the radial direction and circumferential direction caused by the positions of the sub-power feeding terminals 281 is suppressed thereby, and the uniformity of the in-plane temperature distribution can be further improved.

The multiple terminal holes 300p penetrating from the upper surface 302 to the lower surface 303 of the base plate 300 are provided in the base plate 300 at positions corresponding to the power feeding terminals 280. That is, the communicating path 301 is not provided at portions at which the terminal holes 300p are provided. Therefore, the locations of the base plate 300 at which the terminal holes 300p are located have higher temperatures than the location at which the communicating path 301 is provided. The uniformity of the in-plane temperature distribution can be increased by disposing the first circumferential portion that surrounds the second annular portion between the first annular portion and the second annular portion.

Figure 14:
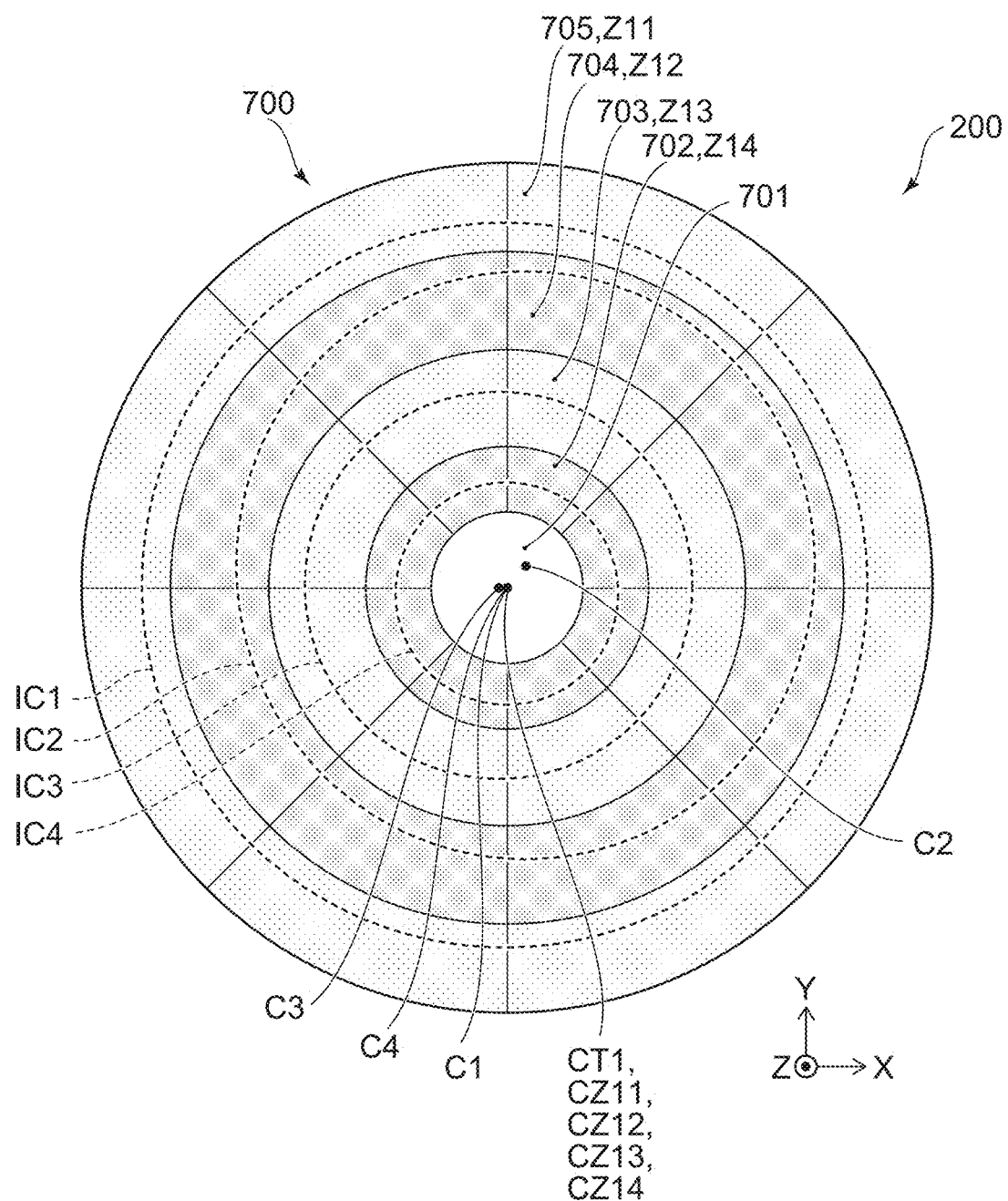
FIG. 14 is a plan view schematically illustrating a portion of the heater unit according to the embodiment.

FIG. 14 is a plan view schematically illustrating a portion of the heater unit according to the embodiment.

FIG. 14 is a view in which the multiple sub-zones 700 and the first to fourth virtual circles IC1 to IC4 are projected onto a plane perpendicular to the Z-direction. As illustrated in FIG. 14, a zone center CZ11 of the first annular zone region Z11, a zone center CZ12 of the second annular zone region Z12, a zone center CZ13 of the third annular zone region Z13, and a zone center CZ14 of the fourth annular zone region Z14 each are aligned with the center CT1 of the first heater element 231. The centers (the zone centers) may be centroids of the planar shape.

The zone center CZ11 of the first annular zone region Z11 is aligned with at least one of a center C1 (a first center) of the first virtual circle IC1 or a center C2 (a second center) of the second virtual circle IC2. Accordingly, for example, the bias of the positions of the sub-power feeding terminals 281 included in at least one of the first annular portion 281A or the second annular portion 281B with respect to the sub-zones 700 included in the first annular zone region Z11 can be suppressed. The uniformity of the in-plane temperature distribution can be further improved thereby.

In the example of FIG. 14, a center CZ11 of the first annular zone region Z11 is aligned with the center C1 of the first virtual circle IC1. In such a case, for example, the bias of the positions of the sub-power feeding terminals 281 included in the first annular portion 281A with respect to the sub-zones 700 included in the first annular zone region Z11 can be suppressed. The first annular portion 281A is positioned outward of the second annular portion 281B. Therefore, for example, the uniformity of the temperature distribution at the outer circumference of the placement surface can be further improved.

In the example of FIG. 14, a center C4 of the fourth virtual circle IC4 is aligned with the center CT1 of the first heater element 231. The center C2 of the second virtual circle IC2 and a center C3 of the third virtual circle IC3 are not aligned with the center CT1 of the first heater element 231. However, the center C2 and the center C3 each may be aligned with the center CT1.

"Aligned" is not limited to perfectly aligned and may be substantially aligned. For example, the degree of difference caused by fluctuation of process conditions or the like is included in "aligned".

Figure 15:
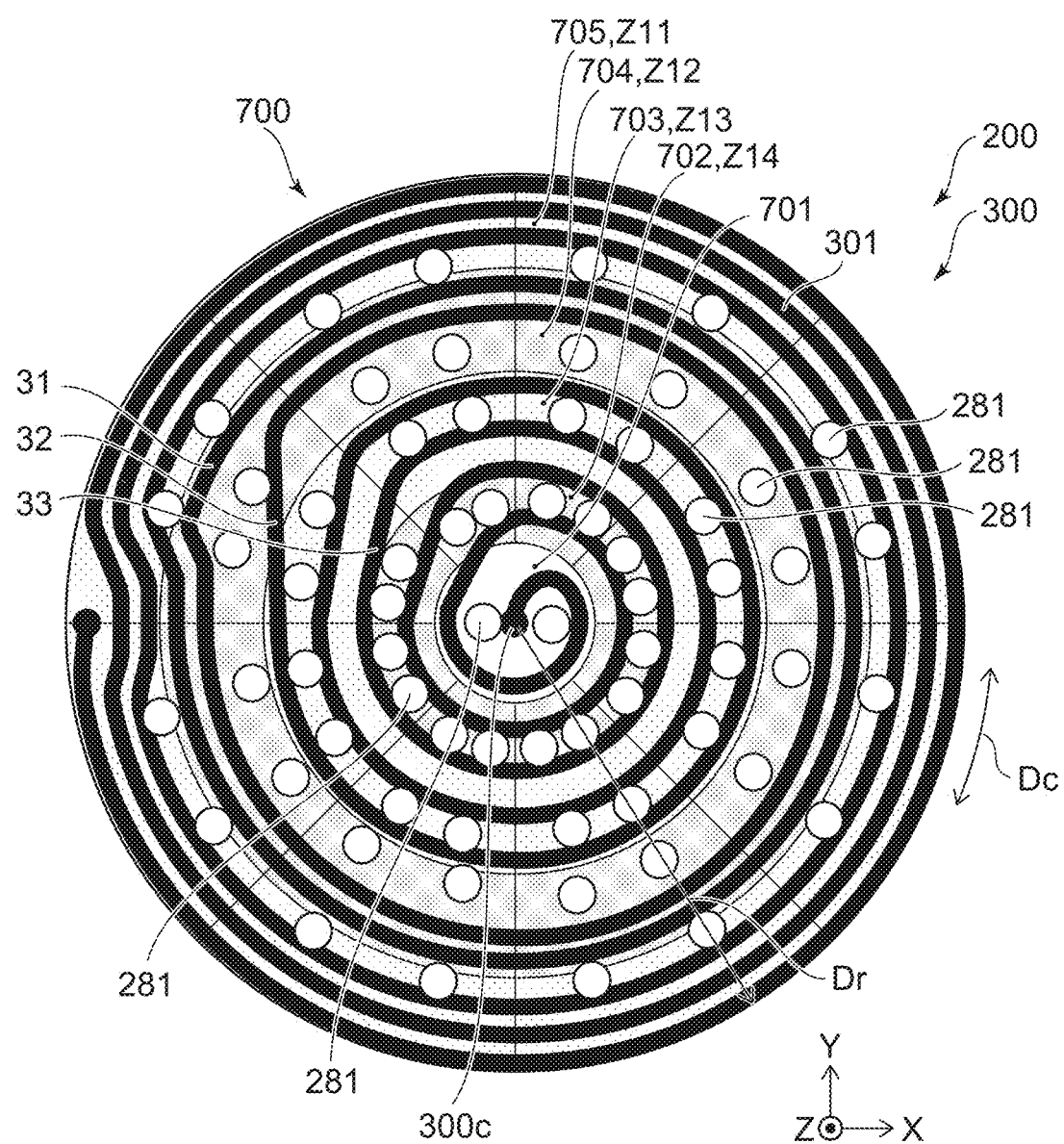
FIG. 15 is a plan view schematically illustrating a portion of a base plate and a heater unit according to a modification of the embodiment.
Figure 16:
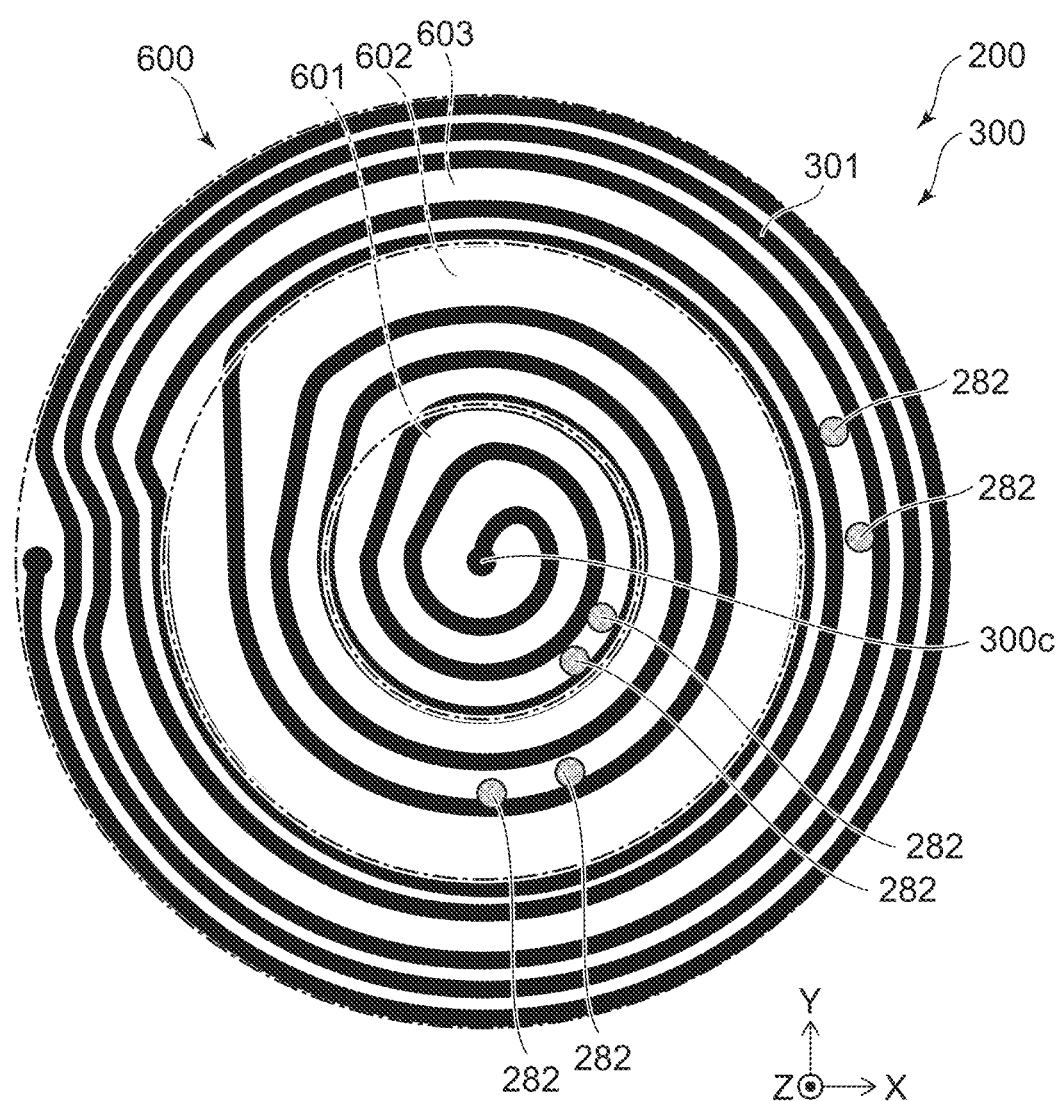
FIG. 16 is a plan view schematically illustrating a portion of the base plate and the heater unit according to the modification of the embodiment.
Figure 17:
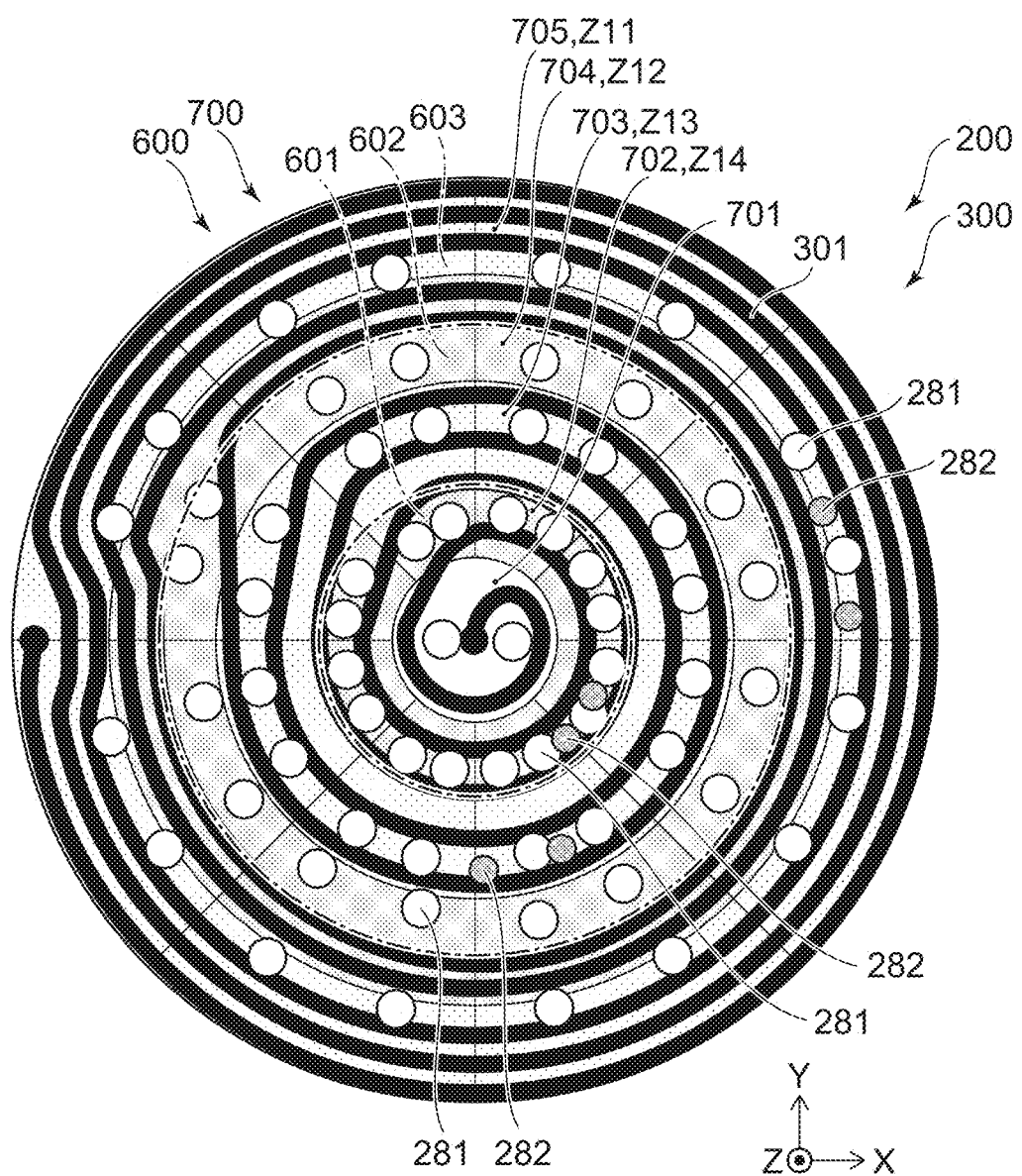
FIG. 17 is a plan view schematically illustrating a portion of the base plate and the heater unit according to the modification of the embodiment.

FIGS. 15 to 17 are plan views schematically illustrating portions of a base plate and a heater unit according to a modification of the embodiment.

FIGS. 15 to 17 illustrate a modification of the base plate 300 and the heater unit 200. The shape of the communicating path 301, the arrangement of the sub-power feeding terminals 281, and the arrangement of the main power feeding terminals 282 of the modification are different from those of the examples described above. Otherwise, a description similar to the examples described above is applicable to the modification.

FIG. 15 is a view in which the communicating path 301, the multiple sub-power feeding terminals 281, and the multiple sub-zones 700 are projected onto a plane perpendicular to the Z-direction.

FIG. 16 is a view in which the communicating path 301, the multiple main power feeding terminals 282, and the multiple main zones 600 are projected onto a plane perpendicular to the Z-direction.

FIG. 17 is a view in which the communicating path 301, the multiple sub-power feeding terminals 281, the multiple sub-zones 700, the multiple main power feeding terminals 282, and the multiple main zones 600 are projected onto a plane perpendicular to the Z-direction.

In the example as illustrated in FIGS. 15 to 17, the communicating path 301 extends along the circumferential direction Dc at the outer circumference portion of the spiral shape without meandering.

Figure 18:
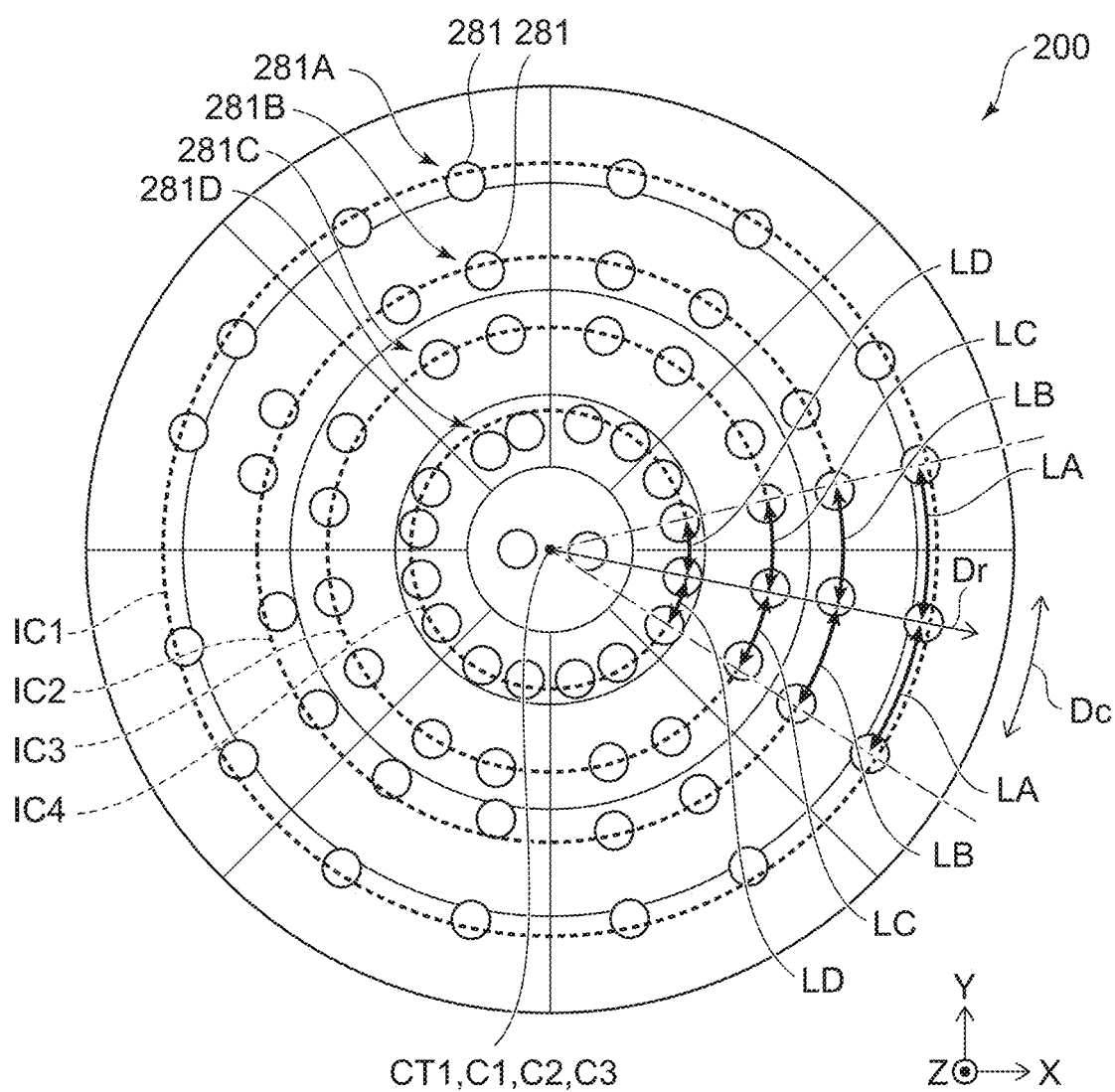
FIG. 18 is a plan view schematically illustrating a portion of the heater unit according to the modification of the embodiment.
Figure 19:
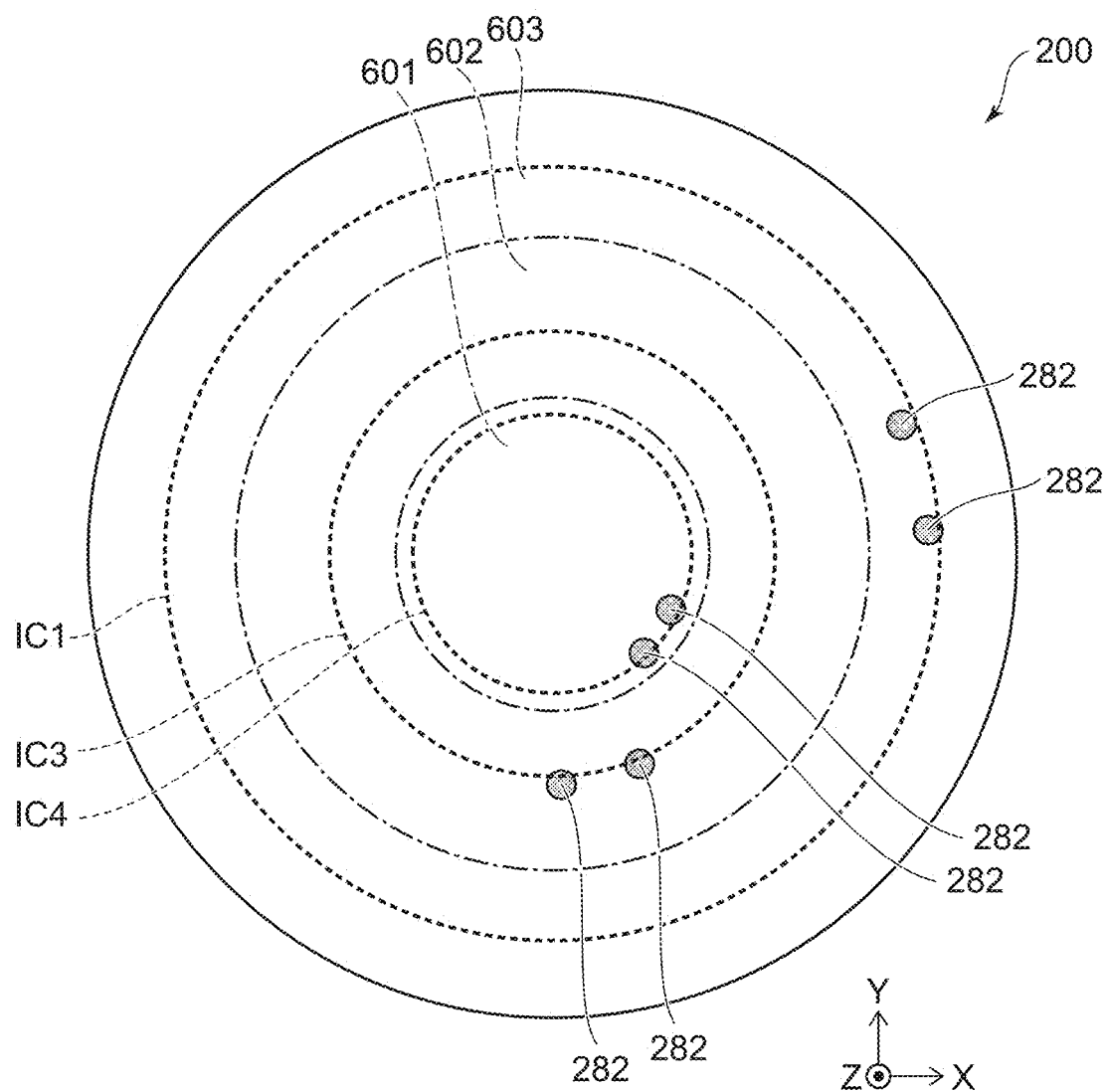
FIG. 19 is a plan view schematically illustrating a portion of the heater unit according to the modification of the embodiment.

FIGS. 18 and 19 are plan views schematically illustrating a portion of a heater unit according to a modification of the embodiment.

FIG. 18 is a view in which the multiple sub-power feeding terminals 281 and the multiple sub-zones 700 illustrated in FIG. 17 are projected onto a plane perpendicular to the Z-direction.

FIG. 19 is a view in which the multiple main power feeding terminals 282 and the multiple main zones 600 illustrated in FIG. 17 are projected onto a plane perpendicular to the Z-direction.

According to the modification as illustrated in FIG. 18 as well, the multiple sub-power feeding terminals 281 include the first annular portion 281A, the second annular portion 281B, the third annular portion 281C, and the fourth annular portion 281D. The multiple sub-power feeding terminals 281 included in the first annular portion 281A are disposed on the first virtual circle IC1; the multiple sub-power feeding terminals 281 included in the second annular portion 281B are disposed on the second virtual circle IC2; the multiple sub-power feeding terminals 281 included in the third annular portion 281C are disposed on the third virtual circle IC3; and the multiple sub-power feeding terminals 281 included in the fourth annular portion 281D are disposed on the fourth virtual circle IC4. As illustrated in FIG. 15, the communicating path 301 includes the first circumferential portion 31, the second circumferential portion 32, and the third circumferential portion 33.

In the example, the first virtual circle IC1, the second virtual circle IC2, and the third virtual circle IC3 have a concentric circular configuration. For example, the center C1 of the first virtual circle IC1, the center C2 of the second virtual circle IC2, and the center C3 of the third virtual circle IC3 each are aligned with the center CT1 of the first heater element 231.

The sub-power feeding terminals 281 included in the first annular portion 281A may be uniformly arranged in the circumferential direction Dc. In other words, a distance LA along the circumferential direction Dc between two sub-power feeding terminals 281 adjacent in the circumferential direction Dc among the sub-power feeding terminals 281 included in the first annular portion 281A may be constant. The uniformity of the temperature distribution in the circumferential direction Dc can be further improved thereby.

Similarly, the sub-power feeding terminals 281 included in the second annular portion 281B may be uniformly arranged in the circumferential direction Dc. In other words, a distance LB along the circumferential direction Dc between two sub-power feeding terminals 281 adjacent in the circumferential direction Dc among the sub-power feeding terminals 281 included in the second annular portion 281B may be constant.

The sub-power feeding terminals 281 included in the third annular portion 281C may be uniformly arranged in the circumferential direction Dc. In other words, a distance LC along the circumferential direction Dc between two sub-power feeding terminals 281 adjacent in the circumferential direction Dc among the sub-power feeding terminals 281 included in the third annular portion 281C may be constant.

The sub-power feeding terminals 281 included in the fourth annular portion 281D may be uniformly arranged in the circumferential direction Dc. In other words, a distance LD along the circumferential direction Dc between two sub-power feeding terminals 281 adjacent in the circumferential direction Dc among the sub-power feeding terminals 281 included in the fourth annular portion 281D may be constant. The uniformity of the temperature distribution in the circumferential direction Dc can be further improved thereby.

"Constant" is not limited to "absolutely no fluctuation", and may be "substantially constant". For example, the degree of difference caused by fluctuation of process conditions, etc., also is included in "constant".

For example, the sub-power feeding terminals 281 included in the first annular portion 281A, the sub-power feeding terminals 281 included in the second annular portion 281B, the sub-power feeding terminals 281 included in the third annular portion 281C, and the sub-power feeding terminals 281 included in the fourth annular portion 281D are arranged in the radial direction Dr.

As illustrated in FIG. 19, the main power feeding terminals 282 that feed power to the main zone 601 may be disposed on the fourth virtual circle IC4 when viewed in plan. The main power feeding terminals 282 that feed power to the main zone 602 may be disposed on the third virtual circle IC3 when viewed in plan. The main power feeding terminals 282 that feed power to the main zone 601 may be disposed on the first virtual circle IC1 (or the second virtual circle IC2) when viewed in plan. The temperature unevenness caused by the main power feeding terminals 282 can be suppressed thereby, and the uniformity of the in-plane temperature distribution can be further improved.

Figure 20:
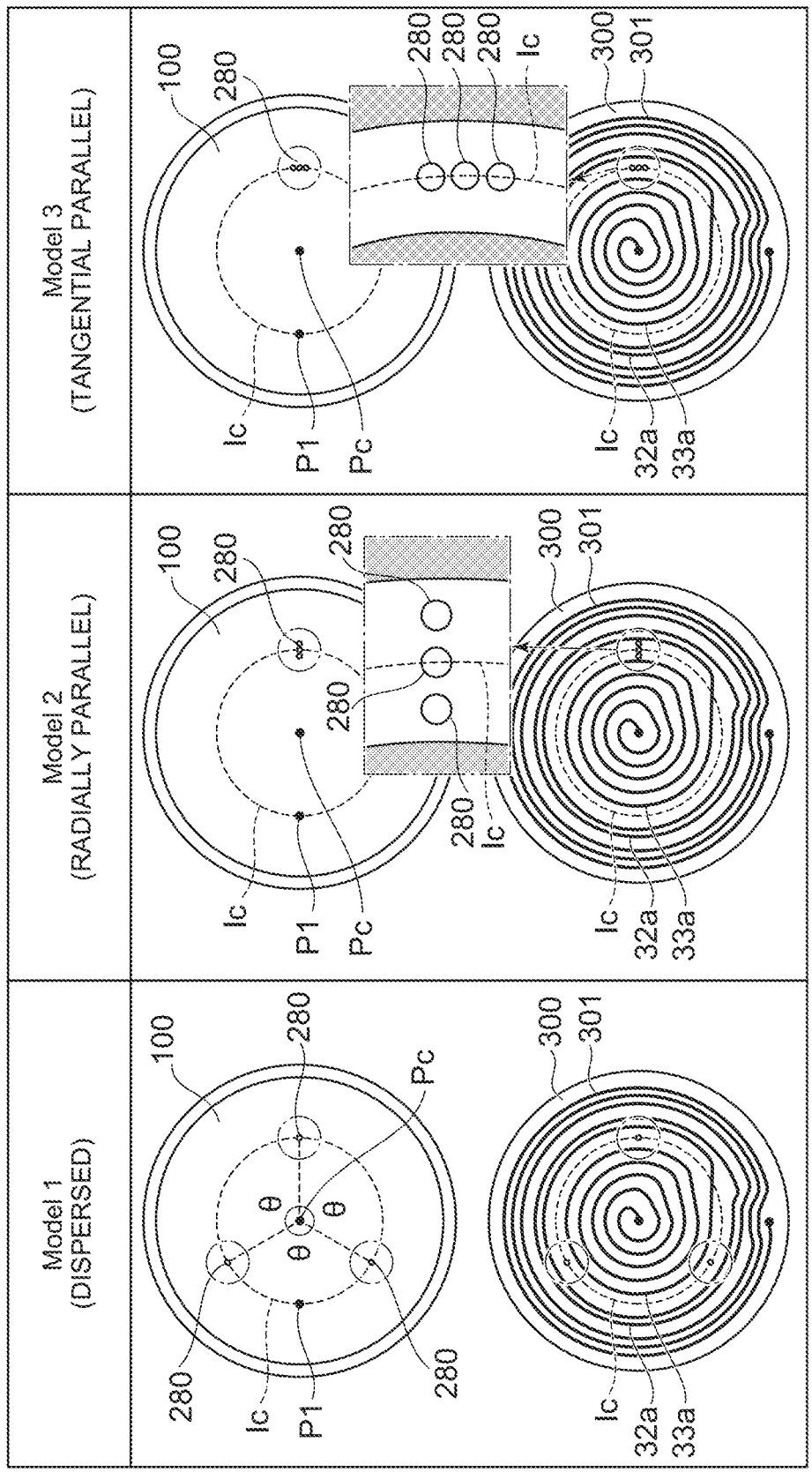
FIG. 20 is a schematic view illustrating models of a simulation of the temperature distribution of the surface of the ceramic dielectric substrate of the electrostatic chuck.

FIG. 20 is a schematic view illustrating models of a simulation of the temperature distribution of the surface of the ceramic dielectric substrate of the electrostatic chuck. A simulation was performed for three models having different arrangement patterns of the power feeding terminals 280 when viewed in plan. Three power feeding terminals 280 were provided in each model. The upper level in FIG. 20 illustrates the arrangement of the power feeding terminals 280 when viewed in plan from above. The lower level in FIG. 20 illustrates the arrangement of the power feeding terminals 280 and the communicating path 301 when viewed in plan from below (the back side). The quadrilateral area of the middle level for a model 2 and a model 3 illustrate the enlarged vicinity of the round symbols of the lower level.

In each model, the communicating path 301 has a spiral shape. As illustrated in FIGS. 9 and 15 above as well, a "spiral shape" may include portions extending linearly and portions extending in circular arc shapes having constant diameters when viewed in plan; and it is sufficient to have a spiral shape as an entirety. In other words, in the example of FIG. 20 as well, the path going from one end to the other end of the communicating path 301 has a shape that separates from the center while turning in the turning direction. According to the embodiment as described above, the communicating path may include a meandering portion. In other words, the communicating path may include portions extending away from the center along the turning direction and portions extending to approach the center along the turning direction. The turning direction is one of clockwise or counterclockwise.

In the model 1 (dispersed), three power feeding terminals 280 are disposed so as to be uniformly dispersed on one virtual circle IC. In other words, the three power feeding terminals are positioned on the same virtual circle IC and are located about every 120° when viewed from a center Pc of the virtual circle IC. In other words, an angle θ between mutually-adjacent power feeding terminals 280 when viewed from the center Pc is 120°.

The communicating path 301 includes a circumferential portion 33a and a circumferential portion 32a. The circular arc-like circumferential portion 32a surrounds the circular arc-like circumferential portion 33a when viewed in plan. The virtual circle IC surrounds the circumferential portion 33a and is surrounded with the circumferential portion 32a when viewed in plan. In other words, the virtual circle IC is positioned between the circumferential portion 32a and the circumferential portion 33a.

In the model 2 (radially parallel), the power feeding terminals 280 are arranged in the radial direction Dr and disposed proximate to each other. The three power feeding terminals 280 are positioned between the circumferential portion 32a and the circumferential portion 33a when viewed in plan. The middle power feeding terminal 280 of the three is positioned on the virtual circle IC; and two power feeding terminals 280 are not positioned on the virtual circle IC.

In the model 3 (tangential parallel), the three power feeding terminals 280 are disposed proximate to each other on the virtual circle IC. The three power feeding terminals 280 are positioned on the virtual circle IC and are adjacent to each other in the circumferential direction Dc.

The temperature distribution of the surface of the ceramic dielectric substrate 100 was analyzed for the models 1 to 3 when a prescribed heat amount (watts) was applied from above while causing a coolant to flow in the communicating path 301.

Figure 21:
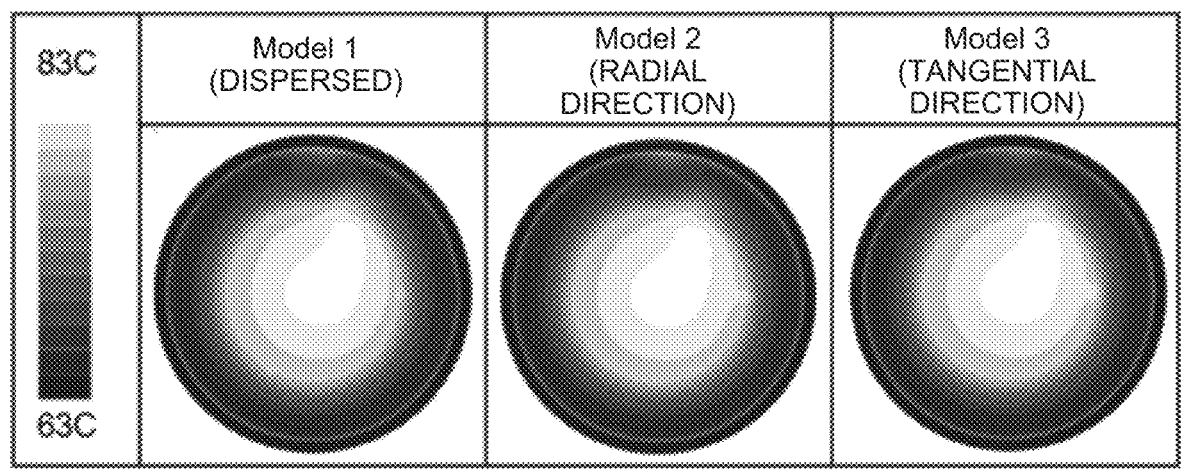
FIG. 21 is a schematic plan view illustrating simulation results of the temperature distribution in the surface of the ceramic dielectric substrate of the electrostatic chuck.

FIG. 21 is a schematic plan view illustrating simulation results of the temperature distribution in the surface of the ceramic dielectric substrate of the electrostatic chuck.

Figure 22A:
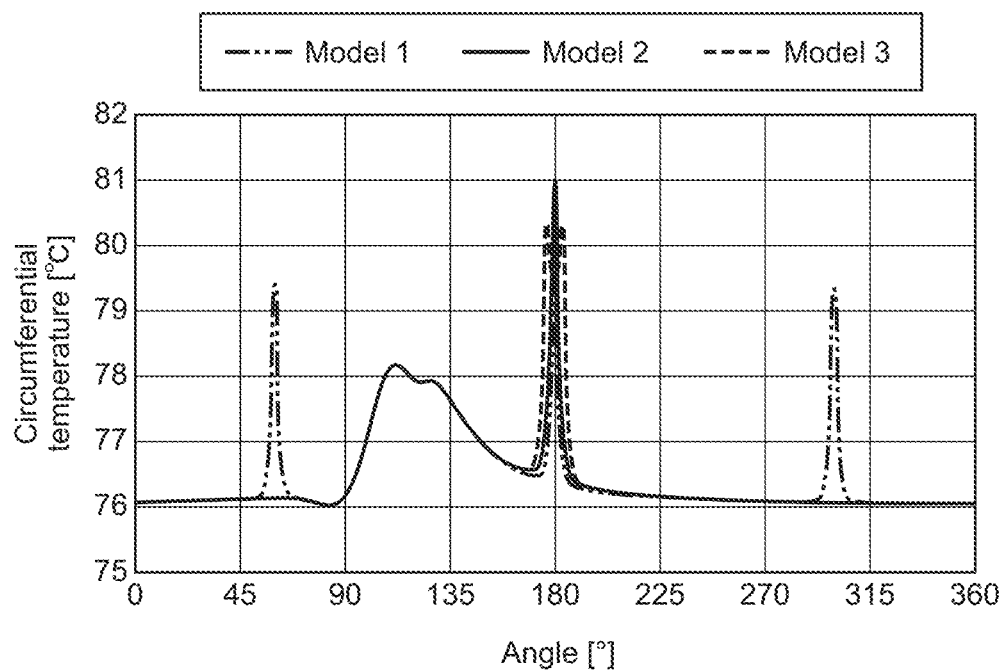
FIGS. 22A and 22B are graphs illustrating the simulation results of the temperature distribution in the surface of the ceramic dielectric substrate of the electrostatic chuck.
Figure 22B:
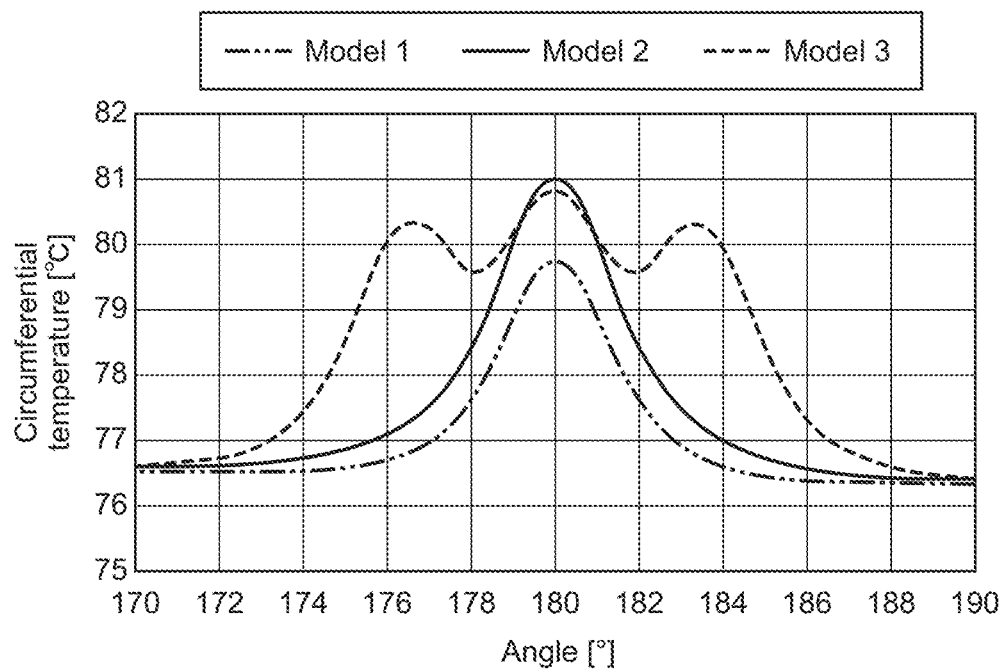

FIGS. 22A and 22B are graphs illustrating the simulation results of the temperature distribution in the surface of the ceramic dielectric substrate of the electrostatic chuck.

FIG. 21 illustrates the in-plane temperature distribution. FIG. 22A illustrates the temperature along the path on the virtual circle IC. The path is one turn counterclockwise from the start point of a point P1 on the virtual circle IC illustrated in FIG. 20. The horizontal axis of FIG. 22A is the angle along the counterclockwise direction from the point P1 on the virtual circle IC when viewed from the center Pc. FIG. 22B is an enlarged view of the area surrounded with the dotted line of FIG. 22A.

Among the three models, the peak temperature in the circumferential direction was lowest for the model 1. Thus, according to the embodiment, it is favorable for the power feeding terminals 280 to be disposed so as to be dispersed on the same circumference. Accordingly, for example, the in-plane temperature distribution can better approach being uniform.

For example, it is favorable for the multiple power feeding terminals 280 that are on the same circumference to be dispersed uniformly. In other words, it is favorable for the angle θ between the power feeding terminals 280 adjacent to each other on the virtual circle IC when viewed from the center Pc to be a constant prescribed angle. The prescribed angle may not be exactly constant and may fluctuate within, for example, a range of about ±10%.

Thus, according to embodiments, an electrostatic chuck is provided in which the uniformity of the in-plane temperature distribution of the process object can be increased.

The invention has been described with reference to the embodiments. However, the invention is not limited to these embodiments. Any design changes in the above embodiments suitably made by those skilled in the art are also encompassed within the scope of the invention as long as they fall within the spirit of the invention. For example, the shape, the size the material, the disposition and the arrangement or the like of the components included in the electrostatic chuck are not limited to illustrations and can be changed appropriately.

The components included in the embodiments described above can be combined to the extent possible, and these combinations are also encompassed within the scope of the invention as long as they include the features of the invention.

What is claimed is:

1. An electrostatic chuck, comprising:
a ceramic dielectric substrate configured to have a process object placed thereon;
a base plate supporting the ceramic dielectric substrate, the base plate having an upper surface at the ceramic dielectric substrate side and a lower surface opposite to the upper surface, the base plate including a communicating path located between the upper surface and the lower surface, the communicating path having a spiral shape and being configured to allow a coolant to pass;
a first heater element including a plurality of first zones arranged in a radial direction and a circumferential direction, the first heater element including not less than twenty of the first zones; and
a plurality of first power feeding terminals feeding power to the plurality of first zones,
wherein each of the plurality of first zones including
a first heater line emitting heat by allowing a current to flow, and
a pair of first power feeding portions feeding power to the first heater line,
a number of the plurality of first power feeding terminals being not less than a number of the first zones,
the pair of first power feeding portions being electrically connected to the plurality of first power feeding terminals,
wherein the plurality of first power feeding terminals including
a first annular portion including a portion of first power feeding terminals among the plurality of first power feeding terminals, the portion of power feeding terminals included in the first annular portion being disposed on a first virtual circle, a number of the portion of first power feeding terminals included in the first annular portion being at least seven, and
a second annular portion including an other portion of first power feeding terminals among the plurality of first power feeding terminals, the second annular portion being positioned inward of the first annular portion, the other portion of first power feeding terminals included in the second annular portion being disposed on a second virtual circle, a number of the other portion of first power feeding terminals included in the second annular portion being at least seven,
wherein the communicating path including a first circumferential portion, the first circumferential portion surrounding the second annular portion between the first annular portion and the second annular portion when viewed along a stacking direction of the base plate and the ceramic dielectric substrate.

2. The chuck according to claim 1, wherein
the plurality of first zones includes a first annular zone region,
the first annular zone region includes a portion of first zones among the plurality of first zones,
the portion of first zones included in the first annular zone region is arranged in a circumferential direction,
the portion of first power feeding terminals included in the first annular portion feeds power to the portion of first zones included in the first annular zone region, and
the number of the portion of first power feeding terminals included in the first annular portion is greater than 2×N1×0.6, where N1 is a number of the portion of first zones included in the first annular zone region.

3. The chuck according to claim 1, wherein
the plurality of first zones includes a first annular zone region,
the first annular zone region includes a portion of first zones among the plurality of first zones,
the portion of first zones included in the first annular zone region is arranged in the circumferential direction,
the portion of first power feeding terminals included in the first annular portion feeds power to the portion of first zones included in the first annular zone region, and
a zone center of the first annular zone region is aligned with at least one of a first center of the first virtual circle or a second center of the second virtual circle.

4. The chuck according to claim 3, wherein
the at least one is the first center of the first virtual circle.

5. The chuck according to claim 1, wherein
the portion of first power feeding terminals included in the first annular portion are uniformly arranged in the circumferential direction.

6. The chuck according to claim 1, further comprising:
a second heater element including a plurality of second zones arranged in at least the radial direction; and
a plurality of second power feeding terminals feeding power to the plurality of second zones,
each of the plurality of second zones including
a second heater line emitting heat by allowing a current to flow, and
a pair of second power feeding portions feeding power to the second heater line,
a number of the plurality of second power feeding terminals being not less than a number of second zones,
the pair of second power feeding portions being electrically connected to the plurality of second power feeding terminals,
at least a portion of the plurality of second power feeding terminals overlapping at least one of the first virtual circle or the second virtual circle when viewed along the stacking direction.

7. The chuck according to claim 6, wherein
the number of the plurality of first zones is greater than the number of the plurality of second zones.

* * * * *